United States Patent
Iwata et al.

(10) Patent No.: US 6,656,799 B2
(45) Date of Patent: Dec. 2, 2003

(54) METHOD FOR PRODUCING FET WITH SOURCE/DRAIN REGION OCCUPIES A REDUCED AREA

(75) Inventors: Hiroshi Iwata, Nara-ken (JP); Seizo Kakimoto, Nara-ken (JP); Masayuki Nakano, Nara (JP); Kouichiro Adachi, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/322,492

(22) Filed: Dec. 19, 2002

(65) Prior Publication Data

US 2003/0107079 A1 Jun. 12, 2003

Related U.S. Application Data

(62) Division of application No. 09/917,954, filed on Jul. 31, 2001, now Pat. No. 6,515,340, which is a division of application No. 09/345,414, filed on Jun. 30, 1999, now Pat. No. 6,291,861.

(30) Foreign Application Priority Data

Jun. 30, 1998 (JP) ............................. 10-185492

(51) Int. Cl.$^7$ ............................................ H01L 21/336
(52) U.S. Cl. ...................................... 438/270; 438/300
(58) Field of Search ................................ 438/270, 300, 438/684, FOR 196, FOR 351

(56) References Cited

U.S. PATENT DOCUMENTS

| | | | |
|---|---|---|---|
| 5,168,072 A | * 12/1992 | Moslehi | ...................... 438/300 |
| 5,391,508 A | 2/1995 | Matsuoka et al. | |
| 5,773,310 A | 6/1998 | Park | |
| 5,908,313 A | * 6/1999 | Chau et al. | .................. 438/299 |

FOREIGN PATENT DOCUMENTS

| JP | 61196577 | 8/1986 |
|---|---|---|
| JP | 6196687 A | 7/1994 |
| JP | 878671 A | 3/1996 |
| JP | 2576506 B2 | 11/1996 |
| JP | 10-335660 A | 12/1998 |

\* cited by examiner

Primary Examiner—George Fourson
Assistant Examiner—Thanh V Pham
(74) Attorney, Agent, or Firm—Birch, Stewart, Kolasch & Birch, LLP

(57) ABSTRACT

A semiconductor device having a device separation region and an active region includes a gate oxide film, a source/drain region, and an electrode which is electrically coupled to the source/drain region. The active region is in contact with the gate oxide film at a first face, a portion of the source/drain regions being located above the first face. The electrode is in contact with the source/drain region at a second face, the second face constituting an angle with respect to the first face.

3 Claims, 27 Drawing Sheets

PRIOR ART

Where no offset is happening

Where offset is happening

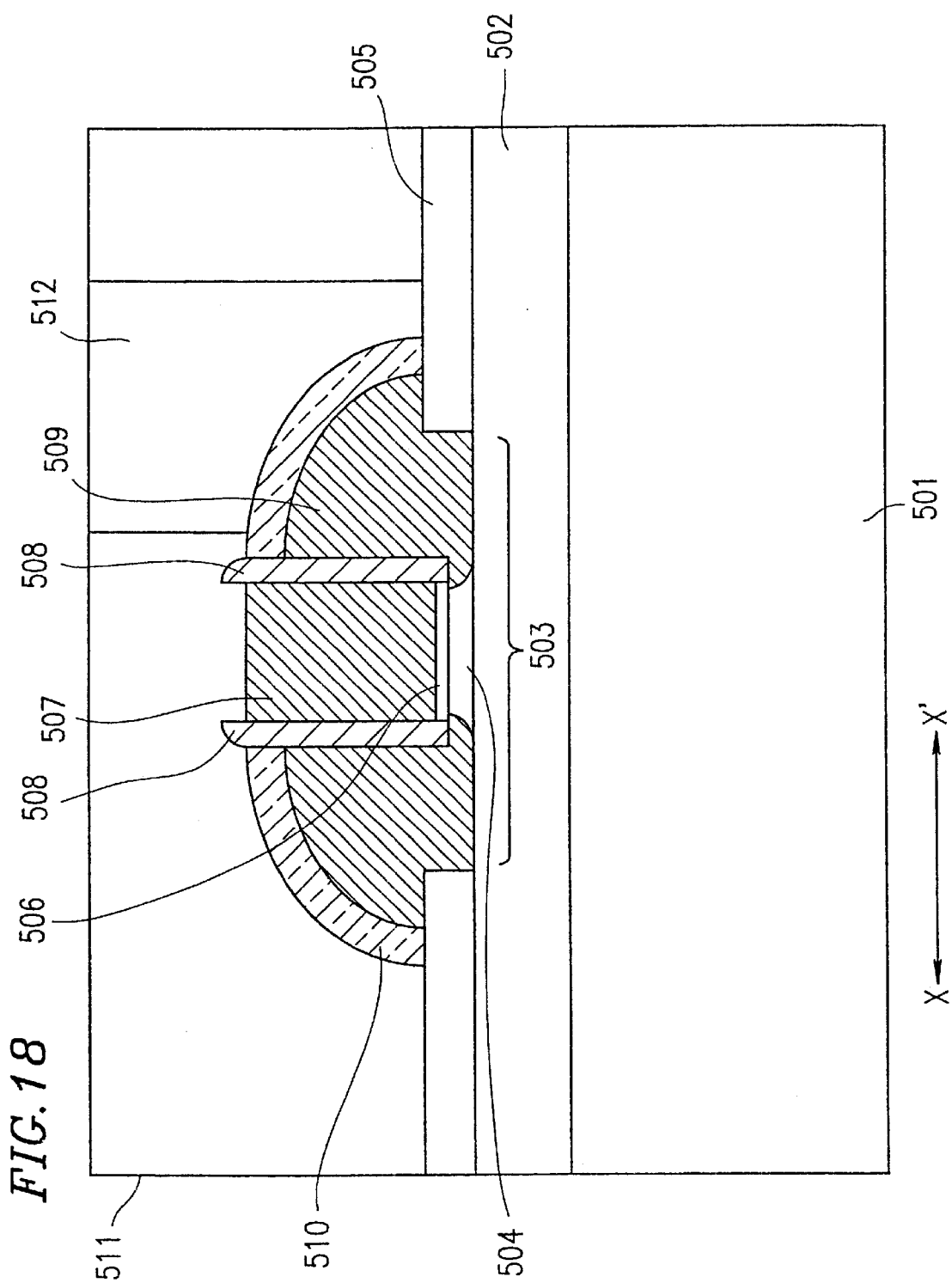

FIG.21

Gate electrode lateral wall insulation film

Polycrystalline silicon film

Gate electrode
Gate oxide film

Dummy gate electrode

X ←→ X'

Device separation region

PRIOR ART

METHOD FOR PRODUCING FET WITH SOURCE/DRAIN REGION OCCUPIES A REDUCED AREA

This application is a divisional of Application No. 09/917,954, filed on Jul. 31, 2001, U.S. Pat. No. 6,515,340, which is a division of application Ser. No. 09/345,414 filed Jun. 30, 1999, now U.S. Pat. No. 6,291,861, the entire contents of which are hereby incorporated by reference and for which priority is claimed under 35 U.S.C. §120; and this application claims priority of Application No. 10-185492 filed in Japan on Jun. 30, 1998 under 35 U.S.C. §119.

BACKGROUND OF THE INVENTION

1. Field of the Invention

The present invention relates to a semiconductor device. In particular, the present invention relates to a semiconductor device in which a source/drain region occupies a reduced area so as to decrease the parasitic capacitance and parasitic resistance of the source/drain region, as well as a method for producing the same.

2. Description of the Related Art

In general, smaller insulation gate type field effect transistors (FETs) become more susceptible to problems such as fluctuation in the threshold voltage due to variation in the gate length caused by processing variations, an increased off-leak current due to deterioration of subthreshold characteristics, and deterioration of transistor characteristics due to short channel effects, e.g., so-called punch-through.

One method for solving such problems has been to reduce the junction depth of the source/drain regions adjoining a channel region of a transistor. A reduced junction depth can be realized by, for example, a structure in which source/drain regions (stacked diffusion layers) are stacked on both sides of a gate electrode so as to be located above the-channel region via gate electrode lateral wall insulation films.

FIGS. 22A, 22B, and 22C are cross-sectional views illustrating-steps of a conventional method for forming stacked diffusion layers.

As shown in FIG. 22A, a gate electrode 1005 whose upper face and side walls are covered with an insulation film 1006 is formed upon a semiconductor wafer 1001, with a gate insulation film 1004 interposed therebetween. The semiconductor wafer 1001 generally includes an active region 1003 (composed of a silicon substrate) and device separation regions 1002 (composed of a silicon oxide film).

Next, as shown in FIG. 22B, a selective epitaxial growth method is used to grow a silicon film 1007 exclusively in regions (source/drain regions) where the silicon surface is exposed, thereby forming stacked diffusion layer regions (which are composed of a semiconductor) in the source/drain regions. A selective epitaxial growth method is disclosed in Japanese Laid-open Publication No. 61-196577.

As shown in FIG. 22C, an interlayer insulation film 1008 is formed, and upper wiring 1010 is coupled to the source/drain regions 1007 via contact wires 1009.

After the silicon film (epitaxial silicon, polycrystalline silicon, etc.) has been formed above the channel region, impurity ions are implanted so as to form the source/drain regions. By thus implanting impurity ions in the stacked silicon films which are located above the channel region, it becomes possible to reduce the junction depth of the source/drain region impurity diffusion layers relative to the channel region of the transistor. As a result, so-called short channel effects can be effectively prevented.

The source/drain regions 1007 extend from the gate electrode 1005 to the device separation regions 1002 along a direction X–X' (commonly referred to as the "gate length direction") which is perpendicular to the longitudinal direction of the gate electrode. When contact holes are formed in such source/drain regions 1007, the length of each source/drain region 1007 will be determined as follows.

FIG. 15 is a diagram illustrating the relationship between a gate electrode, an active region, and contact holes. A positioning margin p is provided between the gate electrode and each contact hole. Each contact hole has a width o. The contact holes are positioned with respect to the source/drain regions with a margin q as illustrated in FIG. 15. It will be appreciated that the length of each source/drain region 1007 cannot become smaller than p+o+q in the semiconductor device illustrated in FIG. 22C.

Thus, it is difficult to reduce the area occupied by the source/drain regions in accordance with the semiconductor device disclosed in Japanese Laid-open Publication No. 61-196577.

SUMMARY OF THE INVENTION

A semiconductor device having a device separation region and an active region according to the present invention includes a gate oxide film, a source/drain region, and an electrode which is electrically coupled to the source/drain region, wherein the active region is in contact with the gate oxide film at a first face, a portion of the source/drain regions being located above the first face; and wherein the electrode is in contact with the source/drain region at a second face, the second face constituting an angle with respect to the first face.

In one embodiment of the invention, the second face is substantially rugged.

In another embodiment of the invention, a portion of the source/drain region partially covers the device separation region.

In still another embodiment of the invention, the height of the source/drain region as measured from the first face along a direction perpendicular to the first face increases toward the gate electrode.

In still another embodiment of the invention, the second face has a curved profile.

In still another embodiment of the invention, a portion of a contact hole for interconnecting the source/drain region and upper wiring is present on the surface of the source/drain region.

In still another embodiment of the invention, a distance between an end of the gate electrode and an end of the contact hole that is located away from the gate electrode in a cross section extending along a direction perpendicular to a longitudinal direction of the gate electrode and through a center of the contact hole is larger than a distance between the end of the gate electrode and an interface between the active region and the device separation region.

In still another embodiment of the invention, a width of the contact hole as measured in a cross section extending along a direction perpendicular to a longitudinal direction of the gate electrode and through a center of the contact hole is larger than a distance between an end of the gate electrode and an interface between the active region and the device separation region.

In still another embodiment of the invention, in a cross section extending along a direction perpendicular to a longitudinal direction of the gate electrode, a distance between an end of the gate electrode and an interface between the active region and the device separation region is smaller than a width of the gate electrode, the width of the gate electrode defining a gate length of the semiconductor device.

In still another embodiment of the invention, a diffusion coefficient of an impurity within a stacked layer constituting the source/drain region is larger than a diffusion coefficient of an impurity within the semiconductor substrate.

In still another embodiment of the invention, the diffusion coefficient of the impurity within the stacked layer is about 2 to about 100 times as large as the diffusion coefficient of an impurity within the semiconductor substrate.

In still another embodiment of the invention, the stacked layer includes polycrystalline silicon.

In still another embodiment of the invention, the polycrystalline silicon includes columnar crystals.

In still another embodiment of the invention, the polycrystalline silicon has a grain size of about 50 nm or less.

In still another embodiment of the invention, a surface of the gate electrode and the source/drain region is covered by a two-layer film, the two-layer film including a polycrystalline silicon film and a refractory metal silicide film.

In still another embodiment of the invention, a junction depth of the source/drain region from the first face is about 0.8 to about 2 times as large as a width of the gate electrode lateral wall insulation film.

In another aspect of the invention, there is provided a method for producing a semiconductor device having a device separation region and an active region, the method including the steps of: forming the device separation region on a silicon substrate from a material which substantially withstands silicon etching; sequentially forming a gate insulation film, a gate electrode, and a gate electrode lateral wall insulation film; coating a polycrystalline silicon film having a thickness which is larger than a distance between the gate electrode and the device separation region along a direction perpendicular to a longitudinal direction of the gate electrode: and performing an anisotropic etching until the polycrystalline silicon film above the gate electrode is substantially removed.

In one embodiment of the invention, the method further includes an ion implantation step of introducing an impurity to form the source/drain region, the impurity becoming one of a donor and an acceptor, and wherein the gate electrode is formed by the introduction of the impurity to become the one of a donor and an acceptor; and the introduction of the impurity to become the one of a donor or an acceptor for the gate electrode and the source/drain region is performed simultaneously by ion implantation.

Alternatively, the method for producing a semiconductor device according to the present invention includes the steps of: forming a device separation region on a silicon substrate from a material which substantially withstands silicon etching; sequentially forming a gate insulation film, a gate electrode, and a gate electrode lateral wall insulation film; coating a polycrystalline silicon film; performing an anisotropic etching until the polycrystalline silicon film above the gate electrode is substantially removed; and removing a portion of the polycrystalline silicon film, the polycrystalline silicon film having been formed on a lateral wall of the gate electrode with the gate electrode lateral wall insulation film being interposed between the polycrystalline silicon film and the lateral wall of the gate electrode.

(1) In accordance with the above constitution, the parasitic resistance of the source/drain region can be reduced. The surface of the source/drain region becomes more elevated with respect to the active region on the semiconductor substrate toward the gate electrode. As a result, when an impurity doping for the source/drain region is performed by ion implantation, the junction depth becomes smaller toward the gate electrode, thereby effectively preventing short-channel effects, which would otherwise become problematic when constructing a downsized semiconductor device.

Since it is possible to secure a large surface area relative to the area occupied by the source/drain region according to the present invention, the contact area between the source/drain region and upper wiring can be increased, thereby reducing the contact resistance relative to the occupied area.

In the case of a configuration employing a salicide (i.e., self aligned silicide), the surface area which is converted into a silicide is increased relative to the occupied area according to the present invention, thereby achieving low resistance. Moreover, failure of silicidation of fine wiring due to hindrance of reaction can be alleviated, which has conventionally been a problem in silicidation reactions.

Moreover, the constitution according to the present invention obviates any vertical protrusion at a gate position, whereby various problems associated with such vertical protrusions of gates during semiconductor device manufacture are solved. For example, the problem of an insufficient etching ratio between a vertical protrusion and an underlying stopper layer during etching, e.g., self-aligned contact (SAC) process, can be prevented so as to facilitate etching. In addition, it is easy to flatten the interlayer insulation film above the gate portion. Since the active region is not exposed to the atmosphere after the source/drain regions are formed, the active region is prevented from being damaged during etching and/or contamination during ion implantation.

(2) According to the present invention, the surface of each source/drain region exhibits a curved and/or slanted profile in a cross section taken along the direction perpendicular to the longitudinal direction of the gate electrode. As a result, the surface area of each source/drain region of the semiconductor device (relative to the area which is occupied by the source/drain region) can be more effectively increased according to the present invention than in conventional structures incorporating source/drain regions having a linear profile.

(3) According to the present invention, at least a portion of a contact hole for coupling the surface of the source/drain region to wiring is present on the surface of the source/drain region. In other words, the diameter of the contact hole aperture can be prescribed to be larger than the length of a portion of the active region from an end of the gate to the device separation region in a cross section extending along a direction perpendicular to a longitudinal direction of the gate electrode. As a result, the diameter of the contact aperture can be increased, thereby facilitating contact hole formation.

In conventional structures, contact holes need to be provided on the source/drain region surface, so that the diameter of each contact needs to be smaller than the width of each source/drain region, thereby making difficult the process of making contact apertures. Furthermore, in accordance with the device structure of the present invention, a sufficient contact area can be secured by providing a contact hole which has a longer dimension along the longitudinal direction of the gate electrode than the dimension along a direction perpendicular to the longitudinal direction of the gate electrode.

(4) In accordance with an embodiment of the invention, the distance between an end of the gate electrode and an end of the contact hole that is located away from the gate electrode in a cross section extending along the direction perpendicular to the longitudinal direction of the gate electrode and through the center of the contact hole is larger than the distance between the end of the gate electrode and an interface between the active region and the device separation region.

As a result, it is possible to provide a large contact hole without increasing the source/drain area, thereby achieving facility in the contact hole formation and reduction in the junction capacitance, which depends on the source/drain junction area.

(5) In accordance with an embodiment of the invention, the width of the contact hole as measured in a cross section extending along the direction perpendicular to the longitudinal direction of the gate electrode and through the center of the contact hole is larger than the distance between an end of the gate electrode and an interface between the active region and the device separation region.

As a result, it is possible to maximize the contact area between the contact holes and the source and drain, while minimizing the source/drain area. Thus, the contact resistance can be reduced.

(6) In accordance with an embodiment of the invention, in a cross section extending along the direction perpendicular to the longitudinal direction of the gate electrode, the distance between an end of the gate electrode and an interface between the active region and the device separation region is smaller than the width of the gate electrode (i.e., the gate length of an MIS (metal insulator semiconductor) type semiconductor device).

As a result, the area occupied by the device can be minimized, and the parasitic junction capacitance at the source/drain region can also be minimized.

(7) In accordance with an embodiment of the invention, the diffusion coefficient of an impurity within a stacked layer constituting the source/drain region is larger than a diffusion coefficient of an impurity within the semiconductor substrate.

As a result, when performing a heat treatment for diffusing and activating an impurity, the diffusion occurs very rapidly down to the interface between the stacked layer and the semiconductor substrate, but only slowly into the silicon substrate. As a result, the junction depth of the source/drain regions from the interface between the stacked layer and the semiconductor substrate is less likely to be affected by variation in the height of the stacked regions, thereby making it possible to produce a shallow junction with much controllability.

(8) In accordance with an embodiment of the invention, the diffusion coefficient of an impurity within the stacked layer is about 2 to about 100 times as large as the diffusion coefficient of an impurity within the semiconductor substrate.

As a result, the junction depth of a portion the source/drain region from the interface between the stacked layer and the semiconductor substrate is less likely to be affected by variation in the height of the stacked regions, thereby making it possible to produce a shallow junction with much controllability.

(9) In accordance with an embodiment of the invention, the stacked layer constituting the source/drain region stacked above the semiconductor substrate is composed essentially of polycrystalline silicon.

Since polycrystalline silicon films are commonly used in the manufacture of semiconductor devices, there is no need to introduce new apparatuses in the process or to determine any new set of process conditions. It is also unnecessary to use a large amount of hydrogen as in the case of employing a selective epitaxial growth apparatus. Thus, the apparatus which is required for manufacturing a semiconductor device according to the present invention occupies much less space than a selective epitaxial growth apparatus (which would require large size equipment for hydrogen removal).

(10) In accordance with an embodiment of the invention, the polycrystalline silicon are columnar crystals.

As a result, the diffusion of impurity occurs very rapidly within the polycrystalline silicon film, and an impurity which is doped into the polycrystalline silicon film can be allowed to diffuse into the silicon substrate with good controllability. The depth of the source/drain regions is less likely to be affected by variation in the height of the polycrystalline silicon, thereby making it possible to produce a shallow junction with much controllability.

(11) In accordance with an embodiment of the invention, the polycrystalline silicon has a grain size of about 50 nm or less.

By employing a polycrystalline silicon having such a small grain size, it becomes possible to obtain a large diffusion coefficient relative to the diffusion coefficient within the semiconductor substrate. It is also possible to minimize the variation in the width of the polycrystalline silicon side walls due to the grains of polycrystalline silicon during etching back.

(12) In accordance with an embodiment of the invention, the gate electrode and the source/drain stacked layer are composed essentially of a two-layer film including a polycrystalline silicon film and an overlying refractory metal silicide film.

As a result, it is possible to realize a very low-resistance contact even without increasing the contact area between the source/drain region and upper wiring. Furthermore, since a silicide film exists near the channel region, it is possible to minimize the parasitic resistance despite a small source/drain junction area, thereby improving the driving current performance of the device. It also becomes possible to utilize the silicide layer as an etching stopper layer during contact hole etching.

(13) A method for producing an MIS type semiconductor device formed on a semiconductor substrate including a device separation region and an active region according to the present invention includes the steps of: forming the device separation region on a silicon substrate from a material which substantially withstands silicon etching; sequentially forming a gate insulation film, a gate electrode, and a gate electrode lateral wall insulation film; coating a polycrystalline silicon film having a thickness which is larger than the distance between the gate electrode and the device separation region along the direction (gate length direction) perpendicular to the longitudinal direction of the gate electrode; and performing an anisotropic etching until the polycrystalline silicon film above the gate electrode is substantially removed.

Specifically, in accordance with the method for producing a semiconductor device of the present invention, a polycrystalline silicon film having a thickness which is larger than the distance between the gate electrode and the device separation region (i.e., the source/drain region width) and an anisotropic etch back process is performed. Because of the deposition of the polycrystalline silicon film having a thickness larger than the distance between the gate electrode and the device separation region (i.e., the source/drain region width), the silicon substrate is prevented from being exposed and/or damaged by an anisotropic etch-back process. By forming the stacked layers by the sides of the gate electrode lateral walls through an anisotropic etch-back process, it is ensured that the end of each stacked layer extends at least partially on a device separation region, which in itself is formed of a material which substantially withstands silicon etching. Since merely performing the above etch-back process may result in the source region and the drain region short-circuiting with each other, it is necessary to separate the stacked region of polycrystalline silicon (formed on the lateral walls of the gate electrode) into discrete source/drain regions.

(14) Alternatively, a method for producing a semiconductor device of the present invention includes the steps of: forming a device separation region on a silicon substrate from a material which substantially withstands silicon etching; sequentially forming a gate insulation film, a gate electrode, and a gate electrode lateral wall insulation film; coating a polycrystalline silicon film; performing an anisotropic etching until the polycrystalline silicon film above the gate electrode is substantially removed; and removing a portion of the polycrystalline silicon film, the polycrystalline silicon film having been formed on a lateral wall of the gate electrode with the gate electrode lateral wall insulation film being interposed between the polycrystalline silicon film and the lateral wall of the gate electrode.

As a result, it is possible to form source/drain regions which are stacked above the gate electrode in a self-aligned manner.

(15) Yet another method for producing a semiconductor device of the present invention includes an ion implantation step of introducing an impurity to form the source/drain region, the impurity becoming a donor or an acceptor (more precisely, the doped region becomes a donor or an acceptor). As described above, the stacked layers of source/drain regions (which are stacked above the semiconductor substrate) are composed of a material such that the diffusion coefficient of an impurity within the stacked layers is larger than the diffusion coefficient of an impurity within the semiconductor substrate. As a result, even by simultaneously performing the impurity doping for the gate electrode and the impurity doping for the source/drain regions, it is possible to produce a device which can prevent the depletion of the gate electrode and/or the penetration of the impurity into the channel region, and which does not have an offset configuration (i.e., a configuration in which the source/drain regions do not substantially reach the channel region in the lateral direction due to insufficient diffusion).

(16) In accordance with an MIS type semiconductor device according to the present invention, source/drain regions are provided so as to adjoin gate electrode lateral wall insulation films flanking the gate electrode and extend above an active region surface, in such a manner that the junction depth of the source/drain region from the first face is about 0.8 to about 2 times as large as the width of the gate electrode lateral wall insulation film.

Thus, the invention described herein makes possible the advantages of (1) providing a semiconductor device whose source/drain regions occupy relatively small areas; and (2) providing a method for producing the same.

These and other advantages of the present invention will become apparent to those skilled in the art upon reading and understanding the following detailed description with reference to the accompanying figures.

BRIEF DESCRIPTION OF THE DRAWINGS

FIG. 18 is a cross-sectional view illustrating a semiconductor device according to Example 5 of the present invention, taken along a direction (X–X') which is perpendicular to the longitudinal direction of a gate electrode 507.

FIG. 21 is a cross-sectional view illustrating another semiconductor device according to Example 6 of the present invention, where a dummy gate electrode is provided.

DESCRIPTION OF THE PREFERRED EMBODIMENTS

EXAMPLE 1

Hereinafter, a semiconductor device according to Example 1 of the present invention will be described with reference to FIGS. 1 to 3.

Figure 1:
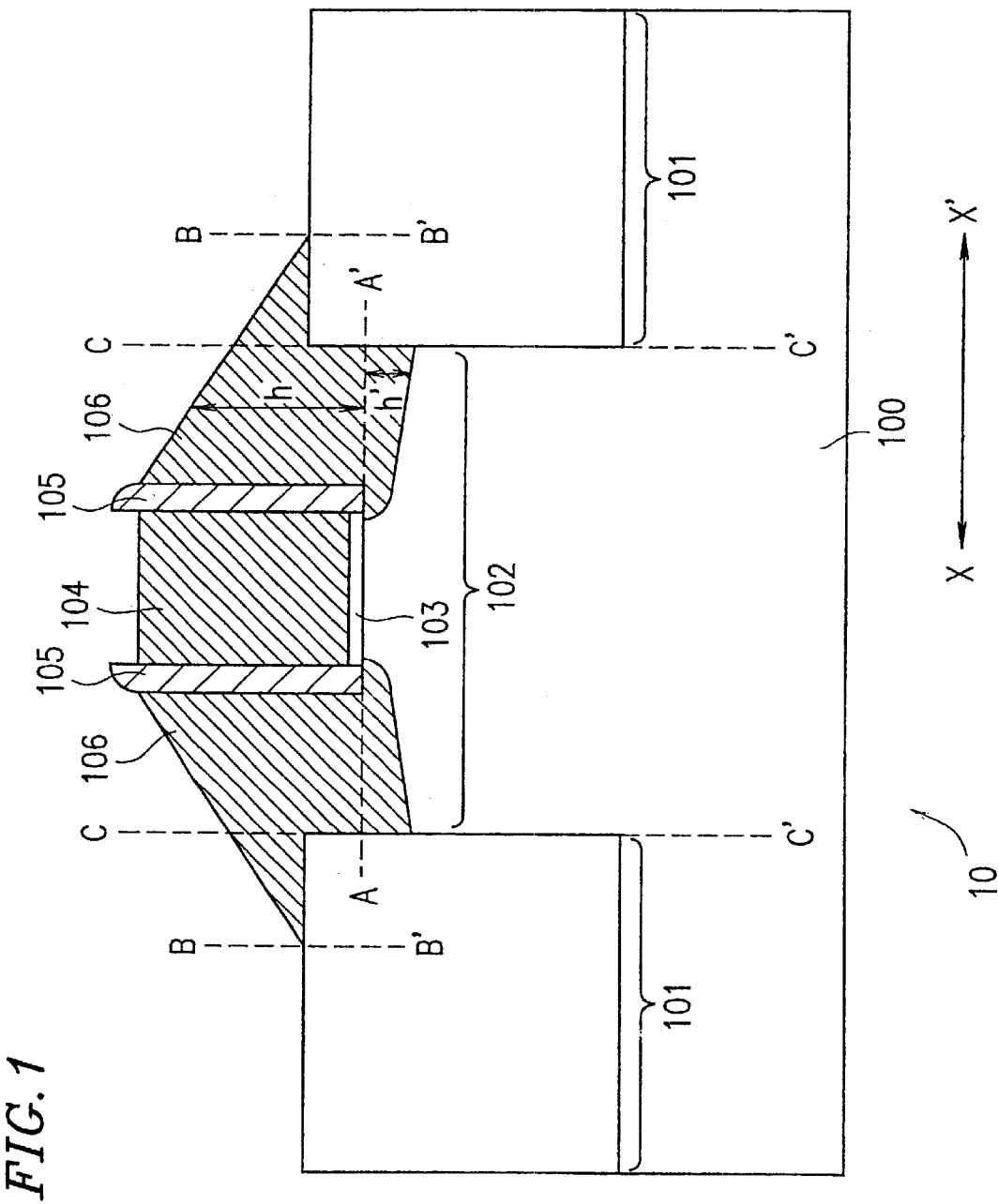
FIG. 1 is a cross-sectional view illustrating a semiconductor device 10 according to Example 1, taken along a direction (X–X') which is perpendicular to the longitudinal direction of a gate electrode 104.

FIG. 1 is a cross-sectional view illustrating a semiconductor device 10 according to Example 1, taken along a direction (X–X') which is perpendicular to the longitudinal direction of a gate electrode 104 of the semiconductor device 10.

The semiconductor device 10 is formed on a semiconductor substrate 100 which generally includes device separation regions 101 and an active region 102. Specifically, the semiconductor device 10 is an MIS type semiconductor element located chiefly in the active region 102 of the semiconductor substrate 100. The semiconductor device 10 includes the device separation regions 101, the active region 102, agate oxide film 103, a gate electrode 104, gate electrode lateral wall insulation films 105, and source/drain regions 106.

The source/drain regions 106 adjoin the respective gate electrode lateral wall insulation films 105. A substantial portion of each source/drain region 106 is located above the active region surface A–A', which marks an interface between the gate insulation film 103 and the-active region 102.

Specifically, each source/drain region 106 is shaped so that the distance h, from the active region surface A–A' to the surface of the source/drain region 106 in a cross section taken along the direction (X–X') perpendicular to the longitudinal direction of the gate electrode 104, increases toward the gate electrode 104 and decreases toward the device separation region 101.

A boundary (C–C') between the active region 102 and the device separation region 101 comes between (along the direction (X–X') perpendicular to the longitudinal direction of the gate electrode 104) the lateral wall of the gate electrode 104 and the farther end of the source/drain region 106 (B–B').

In other words, the gate electrode 104 (which is electrically insulated from the active region 102) and the source/drain regions 106 are formed so as to cover both the active region 102 and a portion of the device separation regions 101 in such a manner as to conceal any stagger between the device separation regions 101 and the active region 102.

As a result, the problem of low yield, which would arise due to vertical stagger or protrusion of the gates of conventional semiconductor devices, is substantially eliminated. For example, it is relatively easy to provide a substantially flat interlayer insulation film in accordance with the semiconductor device 10. Since any stagger between the device separation regions 101 and the active region 102 is covered by the source/drain regions 106, reflection of light is prevented in such staggered portions, thereby facilitating lithography.

The height h of the source/drain regions 106 as measured from the active region surface A–A' to the exposed surface of the source/drain regions 106 becomes larger toward the gate electrode 104. As a result, after performing an ion implantation for doping an impurity into the source/drain regions 106, the resultant source/drain region 106 has a depth h' (as measured from the active region surface A–A') which gradually decreases toward the gate electrode 104. Consequently, the so-called short channel effects, which would become problematic typically when constructing a downsized semiconductor device, can be effectively prevented. Specifically, the depth h' is defined as the depth of the source/drain regions 106 as measured from the active region surface A–A' down to the junction between the source/drain regions 106 and the semiconductor substrate 100 (which, in the case of usual CMOS devices, corresponds to a well region having the opposite conductivity type to that of the source/drain regions 106).

Figure 2:
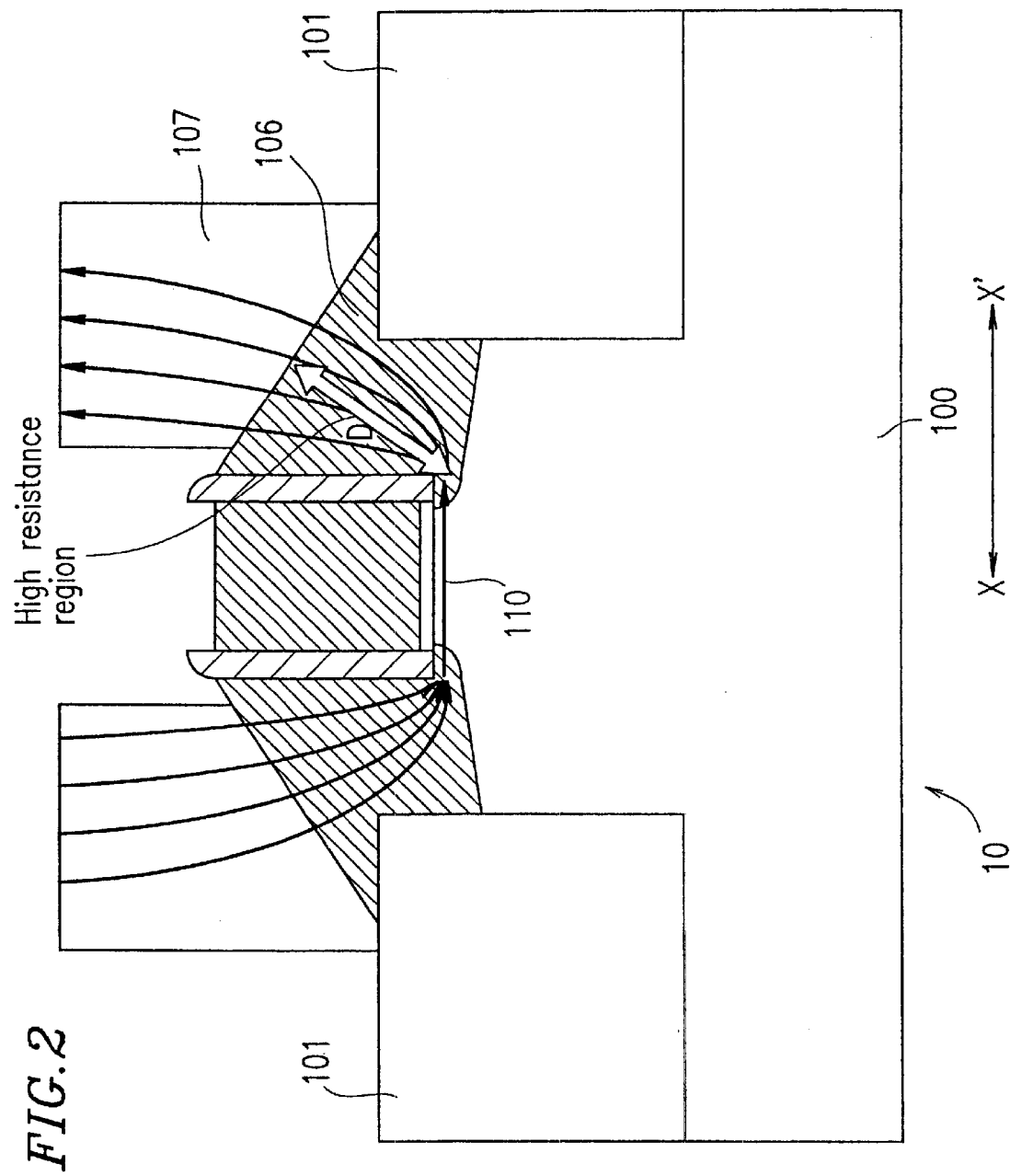
FIG. 2 is a diagram illustrating the flow of a current in a cross section of the semiconductor device 10 according to Example 1, taken along the direction (X–X') perpendicular to the longitudinal direction of the gate electrode 104.

FIG. 2 is a diagram illustrating the flow of a current in a cross section of the semiconductor device 10 according to Example 1, taken along the direction (X–X') perpendicular to the longitudinal direction of the gate electrode 104.

As shown in FIG. 2, a portion of each contact hole 107 for coupling the surface of each source/drain region 106 to upper wiring (not shown) is present on the surface of the source/drain region 106. Although only the outer contours of the contact holes 107 are shown in FIG. 2, it is assumed that the contact holes 107 are filled with a portion of the upper wiring and the like.

Referring back to FIG. 1, in the semiconductor device 10, each source/drain region 106 has a surface area which is larger than the area which is occupied by the source/drain region 106 on the active region surface A–A'. Consequently, the semiconductor device 10 has a smaller contact resistance between the source/drain region 106 and the upper wiring than that of a conventional semiconductor device. In other words, for the same contact hole 107 diameter, the semiconductor device 10 can provide a reduced contact resistance between the source/drain region 106 and any upper wiring.

In the case where the semiconductor device 10 is designed to have the same contact resistance as that of a conventional semiconductor device, the area occupied by the semiconductor device 10, in particular the area occupied by the source/drain regions 106, can be made smaller than that of a conventional semiconductor device. In other words, the junction area between each source/drain region 106 and the semiconductor substrate 100 can be reduced without increasing the contact resistance, thereby effectively reducing the junction capacitance.

Thus, in accordance with the semiconductor device 10, the occupied area, the parasitic capacitance (junction capacitance), and the parasitic resistance can be reduced without increasing the contact resistance. As a result, a very large transconductance can be obtained.

Hereinafter, the flow of a current in the semiconductor device 10 will be described. It is assumed that each contact hole 107 is filled with a metal for connecting the upper wiring to the respective source/drain region 106.

According to the present invention, the proportion of a high-resistance region D in the flow path of the current is very small, so that the parasitic resistance of the source/drain regions 106 is reduced as compared to that of a conventional semiconductor device. Furthermore, the current path becomes broader toward the contacts disposed in the contact holes 107 (i.e., away from the vicinity of the channel region 110), thereby further reducing the parasitic resistance. As a result, the current driving performance of the semiconductor device 10 is enhanced, and the transconductance is improved.

Figure 3:
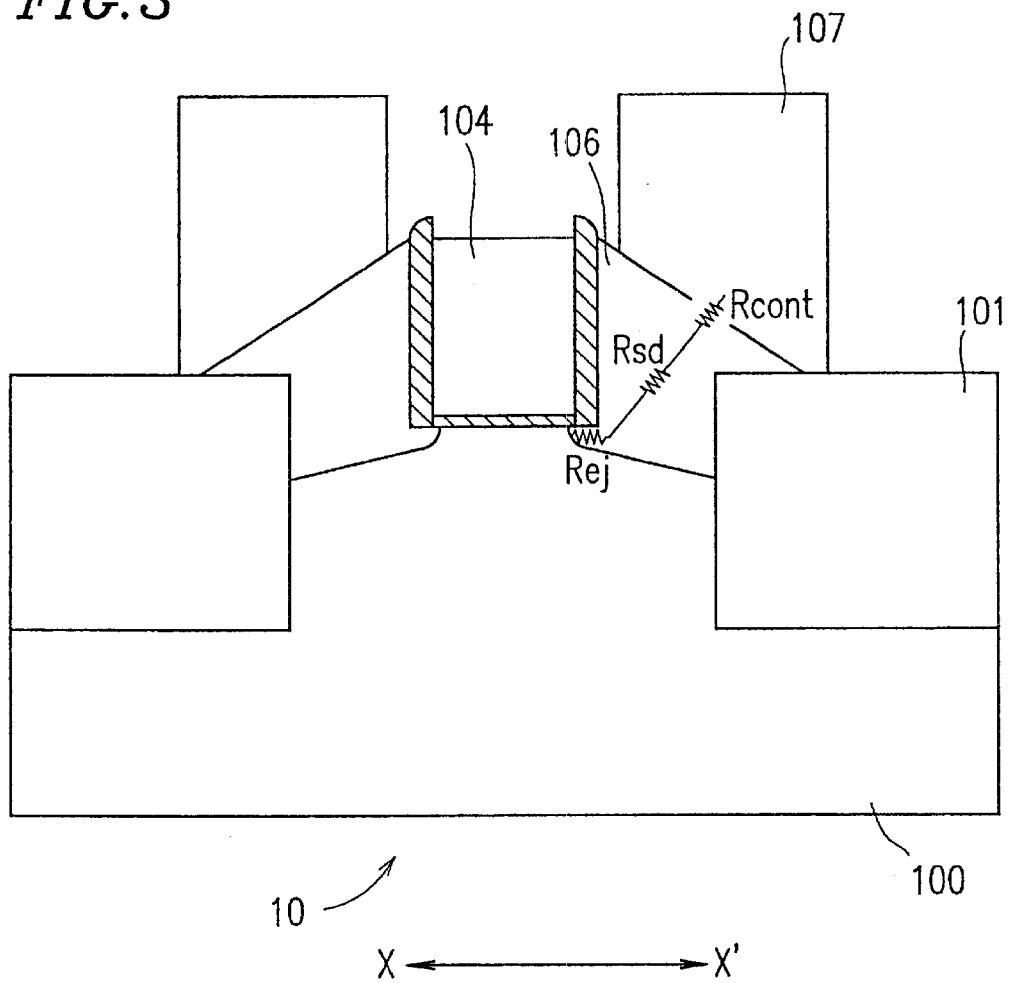
FIG. 3 is a cross-sectional view of the semiconductor device 10, schematically illustrating its parasitic capacitance.
Figure 4:
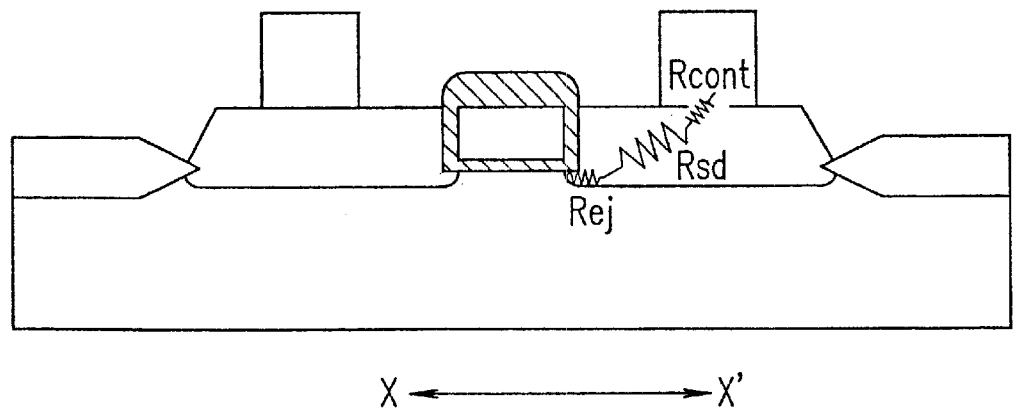
FIG. 4 is a cross-sectional view of a conventional semiconductor device, schematically illustrating its parasitic capacitance.

FIG. 3 is a cross-sectional view of the semiconductor device 10, schematically illustrating its parasitic resistance. FIG. 4 is a cross-sectional view of a conventional semiconductor device, schematically illustrating its parasitic resistance. In FIGS. 3 and 4, Rcont denotes contact resistance; Rsd denotes source/drain resistance; and Rej denotes the spreading resistance of an extended junction (so-called extension).

In accordance with the semiconductor device 10 (FIG. 3), the distance to the channel from the plane at which contact holes 107 come in contact with each source/drain region 106 is much smaller than that in the conventional semiconductor device (FIG. 4). As a result, the source/drain resistance of the semiconductor device 10 is smaller than that of the conventional semiconductor device.

EXAMPLE 2

Hereinafter, a semiconductor device 20 according to Example 2 of the present invention will be described with reference to FIG. 5.

Figure 5:
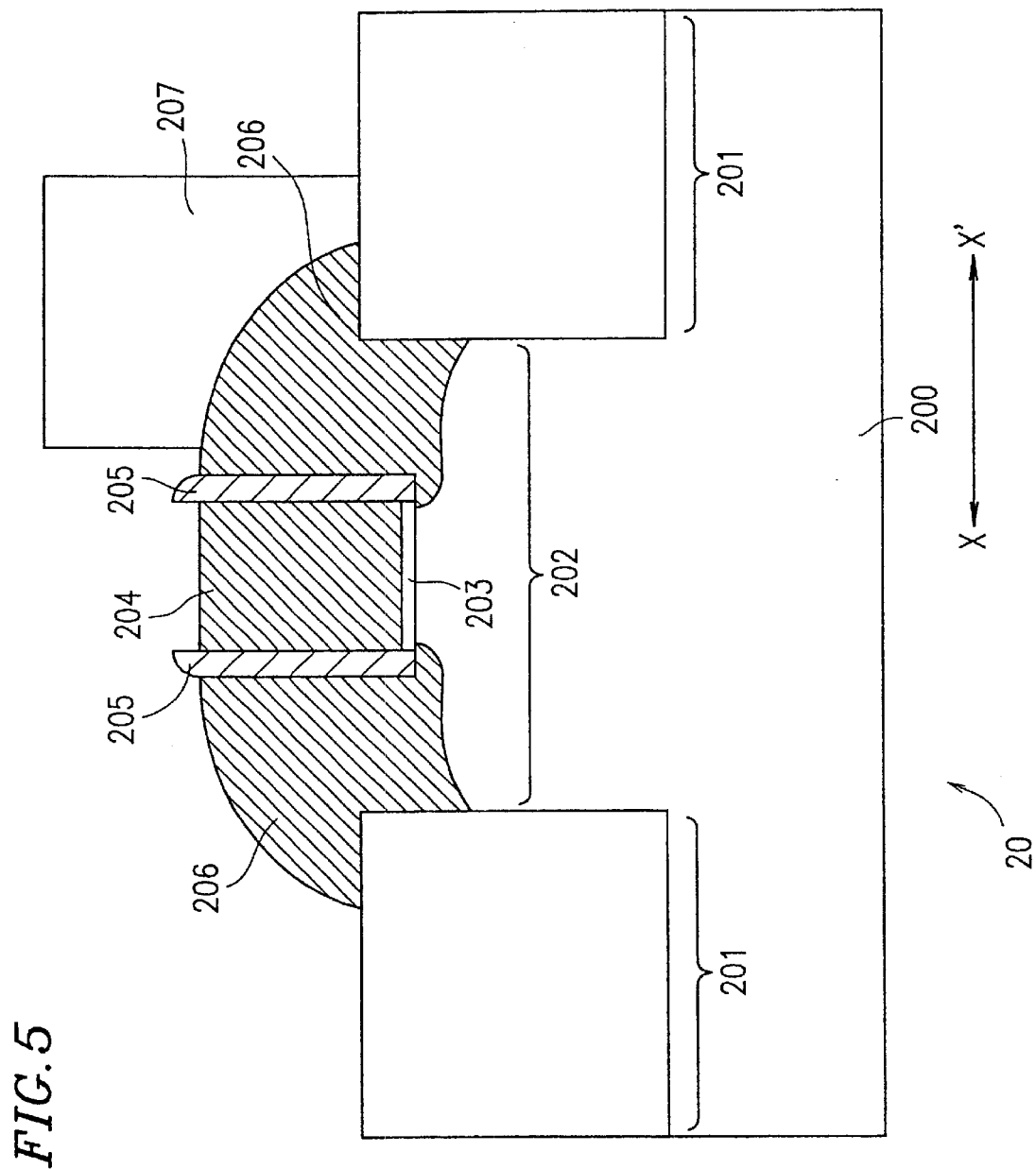
FIG. 5 is a cross-sectional view illustrating a semiconductor device 20 according to Example 2, taken along a direction (X–X') which is perpendicular to the longitudinal direction of a gate electrode 204.

FIG. 5 is a cross-sectional view illustrating the semiconductor device 20 according to Example 2, taken along a direction (X–X') which is perpendicular to the longitudinal direction of a gate electrode 204 of the semiconductor device 20.

The semiconductor device 20 includes device separation regions 201, an active region 202, a gate oxide film 203, a gate electrode 204, gate electrode lateral wall insulation films 205, source/drain regions 206, and contact holes 207. The surface of each source/drain region 206 exhibits a curved profile in a cross section taken along the direction (X–X') perpendicular to the longitudinal direction of the gate electrode 204. As a result, the source/drain regions 206 of the semiconductor device 20 have a larger surface area than that of the source/drain regions 106 of the semiconductor device 10 even if the source/drain regions 206 and the source/drain regions 106 occupy the same area on the substrate. Thus, the semiconductor device 20 allows for an increased connecting area between the source/drain regions and the upper wiring in the contact holes 207.

The methods for producing the semiconductor device 20 will be described later in Examples 3 and 4.

Figure 6:
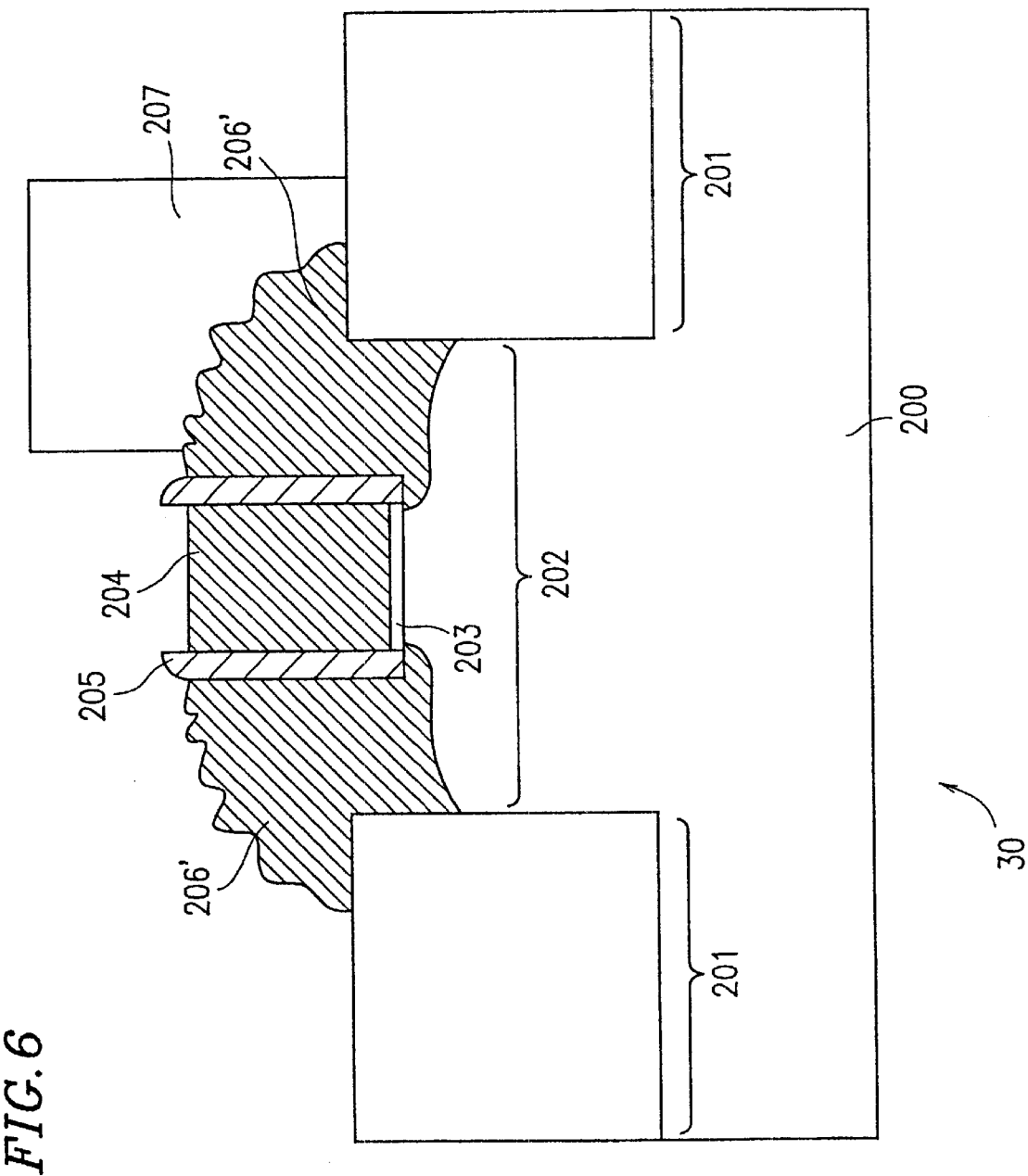
FIG. 6 is a cross-sectional view illustrating another semiconductor device 30 according to Example 2, taken along a direction (X–X') which is perpendicular to the longitudinal direction of a gate electrode 204.

As described in Examples 3 and 4, by etching back polycrystalline silicon to form source/drain regions 206 which are stacked above the channel region, source/drain regions 206' having a rugged surface can be formed due to the grains in the polycrystalline silicon, as shown in FIG. 6, thereby providing a further increased surface area.

EXAMPLE 3

Hereinafter, a method for producing the semiconductor device according to Example 3 of the present invention will be described with reference to FIGS. 7 and 8A to 8G.

Figure 7:
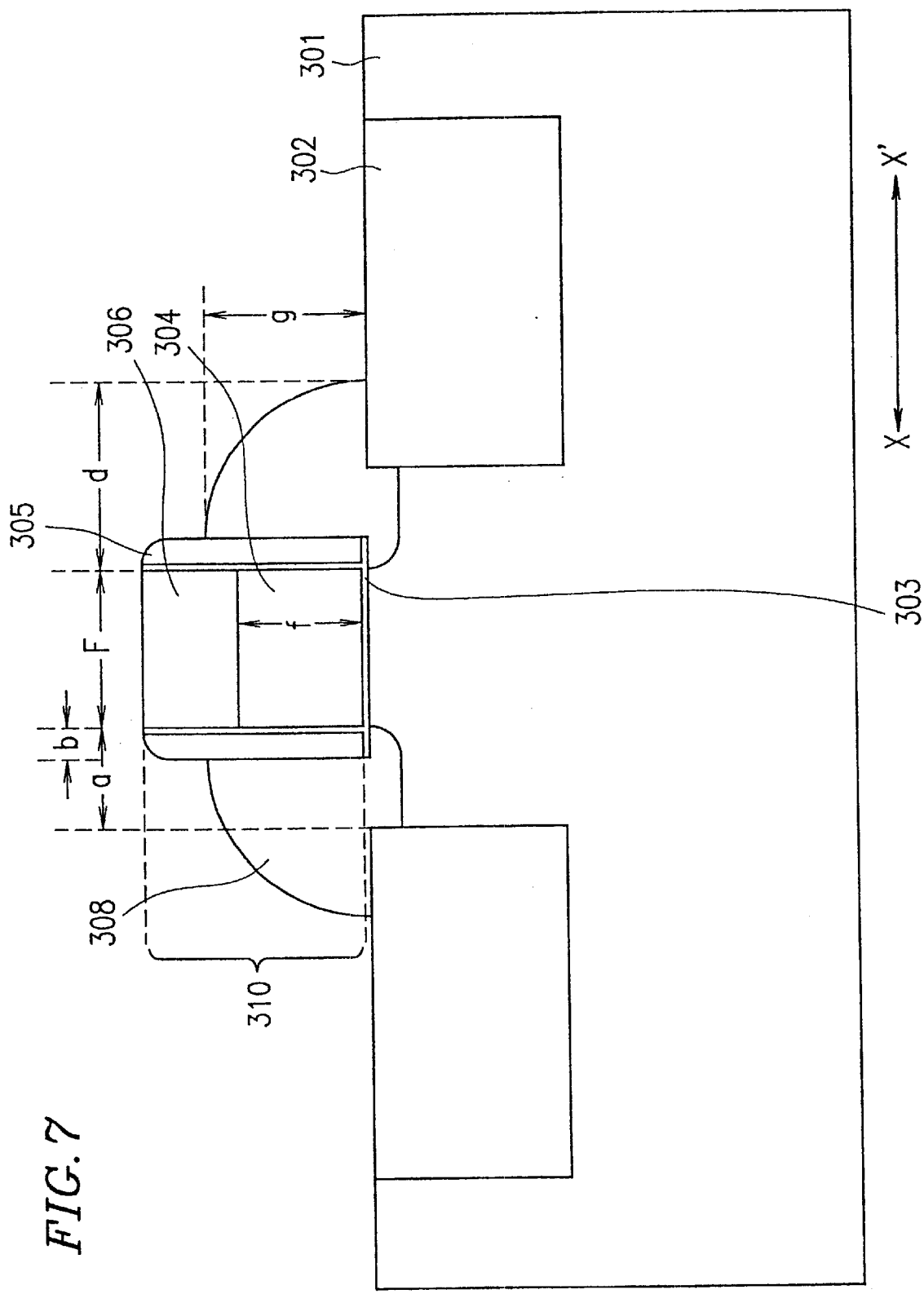
FIG. 7 is a cross-sectional view illustrating a semiconductor produced according to Example 3 at one manufacturing step thereof.

FIG. 7 is a cross-sectional view illustrating the semiconductor to be produced according to Example 3 at one manufacturing step thereof. The semiconductor device shown in FIG. 7 includes a semiconductor substrate 301, device separation regions 302, a gate oxide film 303, a gate electrode 304, gate electrode lateral wall insulation films 305, a silicon oxide film 306, and polycrystalline silicon films 308 to become source/drain regions. In the present example, the inventive semiconductor device is produced by employing a so-called "salicide" process in which a silicide film is formed over a gate electrode, a source region, and a drain region in a self-aligned manner.

In FIG. 7, the gate electrode 304 is designed so as to have a gate length which is equal to the minimum processing dimension F of the semiconductor device. The distance a between the gate electrode 304 and each device separation region 302 is prescribed so that a>b+c, where b represents the thickness of each gate electrode lateral wall insulation film 305 and c represents an alignment margin for aligning the gate electrode 304 with respect to the device separation region 302. In general, the margin a substantially equals F/3.

The area on the semiconductor substrate surface that is occupied by each source/drain region can be calculated as a product of the value a−(b+c) multiplied by the gate width of the transistor. Basically, the width a−(b+c) must be large enough to allow an impurity serving as a donor or an acceptor to be diffused from the stacked region, and should be minimized for a reduced junction capacitance unless the parasitic resistance is greatly increased.

Specifically, the semiconductor device in FIG. 7 is designed by the following rule: F=0.24 μm. The respective dimension parameters are prescribed as follows: a=about 0.16 μm; b=about 0.05 μm; and c=about ±0.08 μm.

FIGS. 8A to 8G show respective steps of a process of manufacturing a semiconductor device.

Figure 8A:
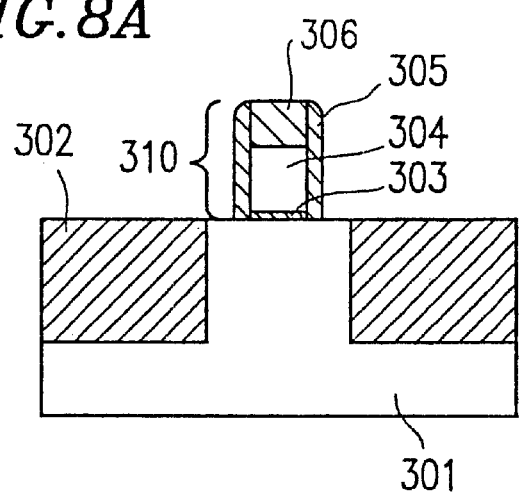
FIGS. 8A to 8G show respective steps of a process of manufacturing the semiconductor device 20.

By using a known method, device separation regions 302, a gate oxide film 303, a gate electrode 304, and gate electrode lateral wall insulation films 305 are formed on a semiconductor substrate 301, or a well region provided therein (FIG. 8A). A silicon oxide film 306 is formed on the gate electrode 304, which in itself is composed of a polycrystalline silicon film. The gate electrode lateral wall insulation films 305 can be composed of silicon oxide and silicon nitride films. Each gate electrode lateral wall insulation film 305 may be composed of a single layer, as illustrated in FIG. 8A, etc.

Figure 8B:
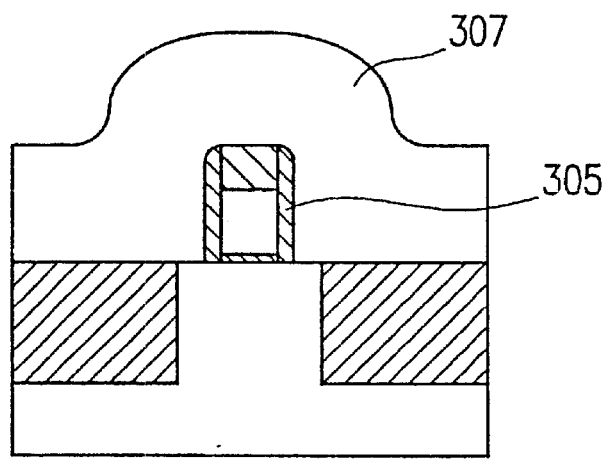

As shown in FIG. 8B, a polycrystalline silicon film 307 is deposited by a chemical vapor deposition (CVD) method. It is important that the polycrystalline silicon film 307 be deposited without any substantial spontaneous oxidation formed at an interface between the surface of an active region of the semiconductor substrate 301 and the deposited polycrystalline silicon film 307. The reason is that, when an impurity which has been introduced in the polycrystalline silicon film 307 to serve as a donor or an acceptor is diffused into the semiconductor substrate 301 through thermal diffusion, any oxidation film that is present at the interface between the active region surface of the semiconductor substrate 301 and the polycrystalline silicon film 307 would act as a diffusion barrier to hinder uniform impurity diffusion (resulting in non-uniform source/drain junction depths), and this would result in unwanted variation in the transistor characteristics.

In order to substantially prevent a spontaneous oxidation film from being formed at an interface between the active region surface and the polycrystalline silicon film 307, the polycrystalline silicon film 307 can be deposited in the semiconductor device shown in FIG. 8A by employing the following method.

According to the present example, a low-pressure CVD (LPCVD) apparatus which includes a preliminary evacuation chamber, a nitrogen purge chamber whose dew point is always maintained at about −100° C., and a deposition furnace, is employed to deposit a polycrystalline silicon film without allowing any spontaneous oxidation film to form at an interface between the active region surface of the semiconductor substrate and the polycrystalline silicon film to be deposited.

Specifically, the semiconductor substrate 301 (FIG. 8A) is washed with a fluorine type solution immediately before depositing the polycrystalline silicon film 307. After removing the spontaneous oxidation film, the semiconductor substrate 301 is conveyed into the preliminary evacuation chamber. The preliminary evacuation chamber is subjected to a vacuum evacuation to remove the atmosphere which existed during the conveyance, and thereafter the semiconductor substrate is conveyed into the nitrogen purge chamber, whose atmosphere has been replaced by a nitrogen atmosphere with a dew point which is always maintained at about −100° C.

The nitrogen purge chamber is employed to effect a nitrogen purge in order to substantially completely eliminate the water molecules which have been adsorbed on the wafer surface. The inventors of the present invention have confirmed through experimentation that the water molecules adsorbed on the wafer surface, which cannot be eliminated within a vacuum, can be substantially completely eliminated through nitrogen purge.

In a conventional LPCVD apparatus, the wafer would be conveyed into the deposition furnace with the aforementioned water molecules being still adsorbed on the wafer surface. The deposition of a polycrystalline silicon film is conventionally performed at a temperature in the range of about 550° C. to about 700° C. When the wafer is brought into such a high-temperature deposition furnace, the oxygen component of the adsorbed water molecules reacts with the silicon wafer, whereby a spontaneous oxidation film may form on the silicon wafer surface before the deposition of the polycrystalline silicon film. Thus, a spontaneous oxidation film may be formed at an interface between the active region surface of the semiconductor substrate and the deposited polycrystalline silicon film.

In contrast, in accordance with the LPCVD apparatus of the present example, the semiconductor substrate is conveyed into the nitrogen purge chamber whose dew point is always maintained at about −100° C. so as to substantially completely eliminate the adsorbed water molecules, before the semiconductor substrate is conveyed into the deposition furnace. As a result, the polycrystalline silicon film 307 can be formed without allowing a spontaneous oxidation film to form.

Figure 8C:
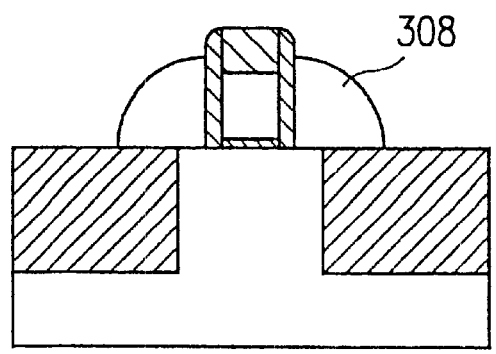

Then, in the next step, the polycrystalline silicon film 307 is subjected to an anisotropic etch-back process as to leave a polycrystalline silicon film 308 in the fashion of a pair of side walls adjoining the gate electrode lateral wall insulation films 305, as shown in FIG. 8C.

It should be noted that the ends of the polycrystalline silicon film side walls resulting after the anisotropic etch-back process must at least partially overlap the respective device separation regions 302.

Figure 9:
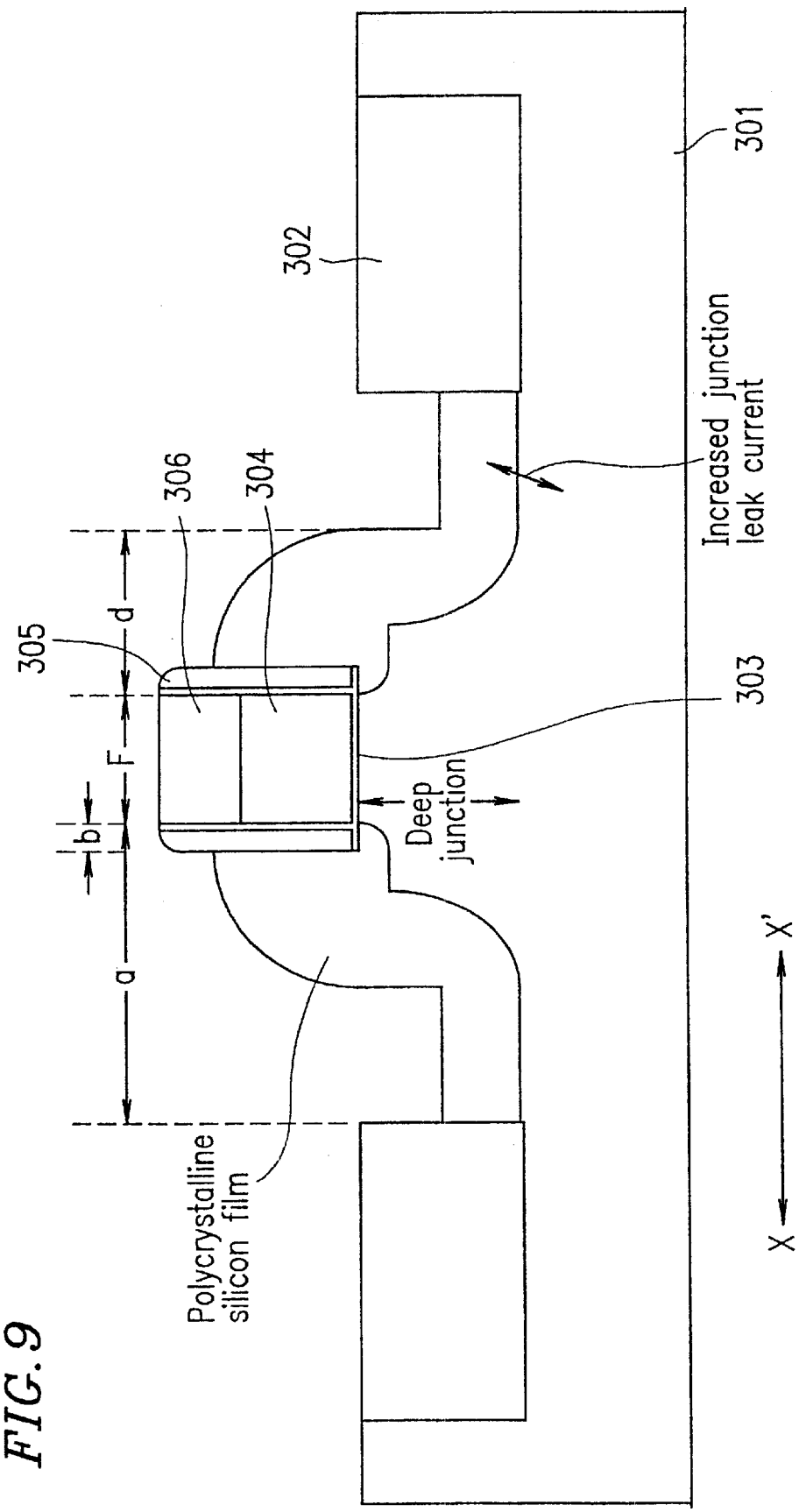
FIG. 9 is a cross-sectional view illustrating a semiconductor device, taken along a direction (X–X') which is perpendicular to the longitudinal direction of its gate electrode.

If the distance a is prescribed so as to be longer than the width d of the polycrystalline silicon film side walls as shown in FIG. 9, the silicon substrate 301 may be eroded by the anisotropic etch-back process. Thus, the silicon semiconductor substrate 301 maybe damaged so that the junction leak current may increase and the short-channel effects may be aggravated due to a deepened junction.

The width d of the polycrystalline silicon film side walls is determined by the protrusion of the gate electrode 304 (i.e., its height including the silicon oxide film 306 formed on the gate polycrystalline silicon film 304) and the thickness of the deposited gate polycrystalline silicon film 307. Specifically, the width d of the polycrystalline silicon film side walls must satisfy d>a+c. In the present example, it is assumed that a=about 0.16 $\mu$m; c (alignment margin between the gate electrode 304 and each device separation region 302)=about ±0.08 $\mu$m; and d (width of the polycrystalline silicon film side walls)=0.3 $\mu$m. Furthermore, the protrusion of the gate electrode 304 is prescribed as about 300 nm to about 400 nm, and the thickness of the deposited gate polycrystalline silicon film 307 is prescribed as about 400 nm to about 500 nm.

The various parameter values are a mere exemplification of the F=0.24 $\mu$m rule. It will be appreciated that the present invention can also be realized by employing other parameter values which satisfy a>b+c and d>a+c.

Furthermore, in order to reduce the gate lateral wall capacitance, it is necessary to minimize the projection of the gate electrode while satisfying d>a+c.

The polycrystalline silicon film 307 is etched back in the above-described manner. The etch-back process is performed by employing a helicon-type RIE apparatus with a gaseous mixture of chlorine and oxygen under a pressure of about 0.3 pa. An endpoint detection device (EPD) is preferably employed so as to ensure that the polycrystalline silicon film 307 is overetched by about 10% to about 30%.

Figure 10:
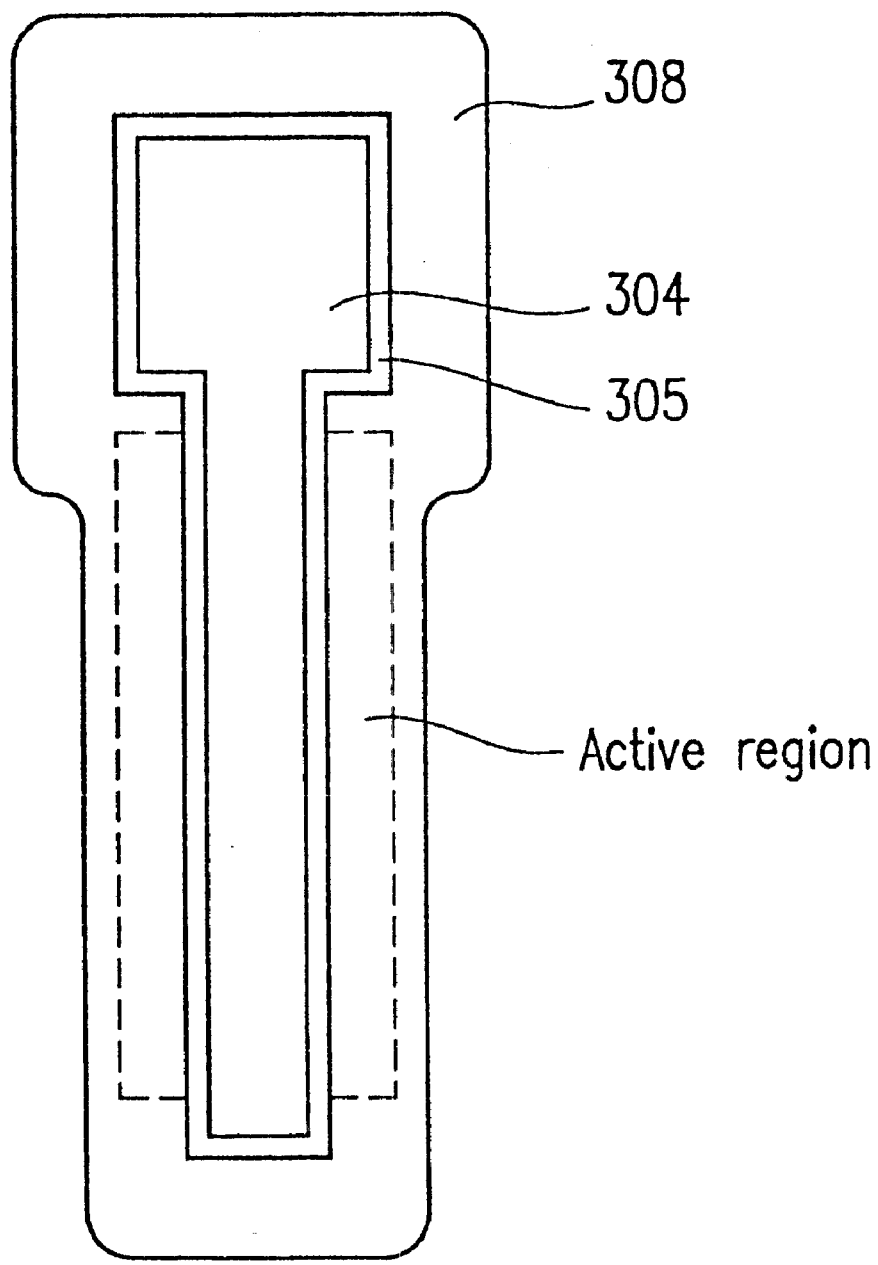
FIG. 10 is a plan view of a semiconductor device illustrating a state in which a polycrystalline silicon film 308 is left around a gate electrode 304 with a gate electrode lateral wall insulation film 305 interposed therebetween.

Merely performing an etch-back process leaves the polycrystalline silicon film 308 around the gate electrode 304 with the gate electrode lateral wall insulation films 305 interposed therebetween, as shown in FIG. 10.

Figure 11:
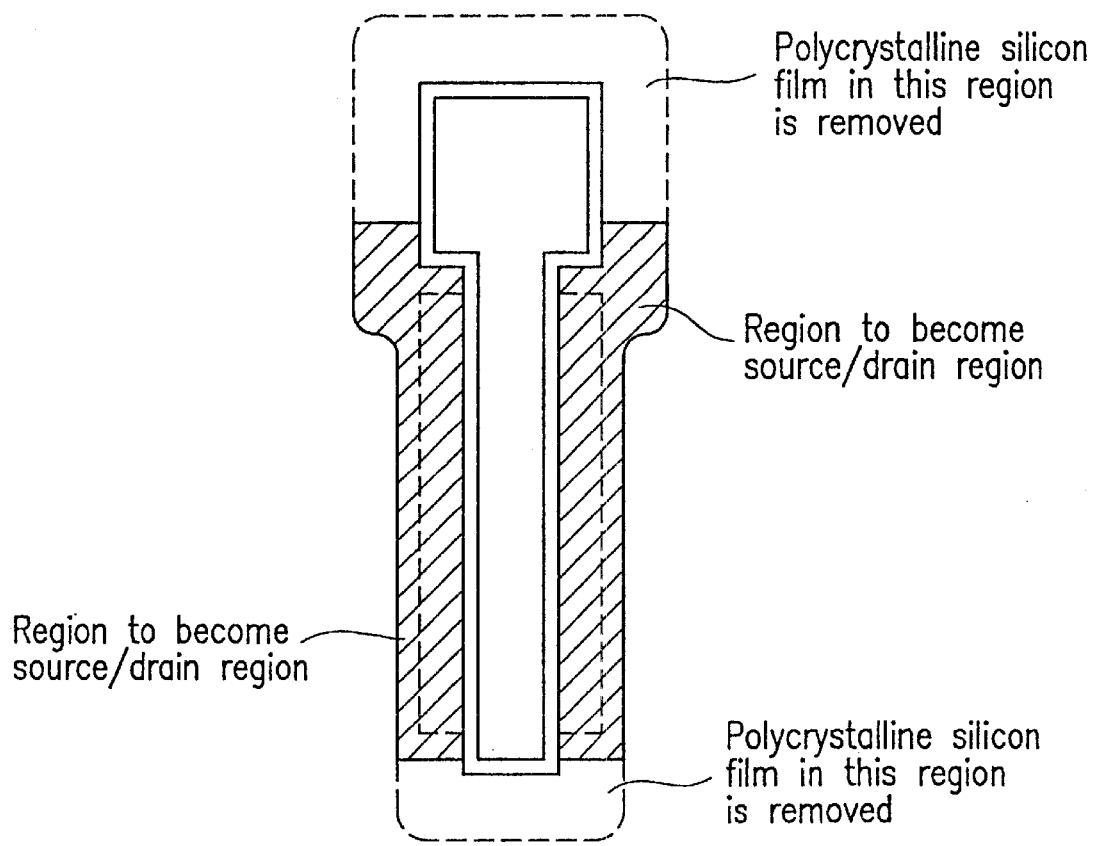
FIG. 11 is a plan view of a semiconductor device illustrating separated source/drain regions.

Now, in order to utilize the polycrystalline silicon film as stacked source/drain regions, it is necessary to separate the source/drain regions as shown in FIG. 11.

In the present example, regions other than the regions to be removed are covered with a resist mask, and a dry etching is performed to define the source/drain regions.

The etching may be performed so as to allow a degree of side etching to ensure that the source/drain regions are securely separated even in the case where the gate electrode lateral walls are not substantially perpendicular with respect to the substrate surface (i.e., the gate section has a larger upper portion than its lower portion). Such etching is preferable because, if the gate section has a larger upper portion than its lower portion, the gate section may serve as a mask to prevent the portion of the polycrystalline silicon film 308 that is present around the gate electrode and which needs to be removed from being sufficiently etched away. Such etching to allow a degree of side etching is performed by employing a helicon-type RIE apparatus with a gaseous mixture of hydrogen bromide and oxygen under a pressure of about 0.4 pa.

Figure 8D:
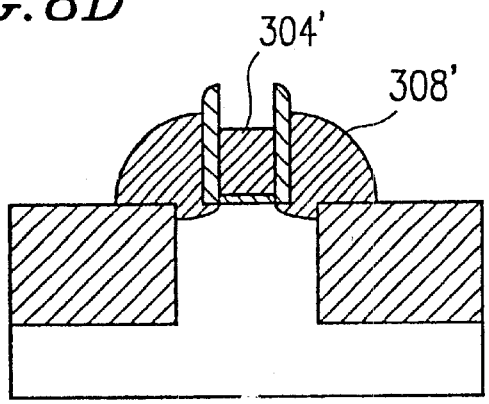

After the silicon oxide film 306 above the gate electrode polycrystalline silicon film 304 is etched away, impurity ions are implanted so as to form source/drain regions. According to the present example, as shown in FIG. 8D, doping for the gate electrode 304' and the doping for the source/drain regions 308' are effected simultaneously.

Hereinafter, exemplary ion implantation conditions according to the present example will be described.

For example, the thickness f of the gate polycrystalline silicon film may be about 200 nm to about 250 nm, and the largest height g (FIG. 7) of the stacked regions, near the gate electrode, may be about 200 nm to about 300 nm. In the case of ion implantation for an n-channel transistor, phosphorous ions are implanted with an energy of about 20 keV to about 80 keV in a dose of about $1\times10^{15}$ to about $1\times10^{16}/cm^2$. In the case of ion implantation for a p-channel transistor, boron ions are implanted with an energy of about 10 keV to about 40 keV in a dose of about $1\times10^{15}$ to about $1\times10^{16}/cm^2$.

In order to prevent penetration through the gate oxide film due to channeling and to control the diffusion within the polycrystalline silicon film, the ion implantation may be performed by beginning with a previous implantation of about $5\times10^{14}/cm^2$ to about $5\times10^{15}/cm^2$ silicon ions and making an amorphous semiconductor. In this case, the grain boundaries in the polycrystalline silicon are destroyed to some extent. Therefore, it is necessary to select amorphous conditions which are suitable for the respective impurity ion species when forming a CMOS.

Next, after ion implantation, the semiconductor substrate into which ions have been implanted is subjected to a heat treatment at about 800° C. to about 950° C. for about 10 to about 120 minutes. Alternatively, the semiconductor substrate into which the ions have been implanted is subjected to a rapid thermal annealing (RTA) at about 950° C. to about 1100° C. for about 10 to about 60 seconds. As a result, the implanted impurity is activated and diffused into the silicon substrate. The heat treatment needs to be performed so as to cause the impurity to thermally diffuse deep enough to prevent the source/drain regions from being located offset with respect to the gate electrode. Specifically, the impurity needs to be diffused over a lateral distance that corresponds to the thickness of each gate electrode lateral wall insulation film. In order to enhance the transistor characteristics (i.e., so as to prevent short-channel effects and improve the driving current), it is necessary to minimize the junction depth while ensuring that the source/drain regions are not offset with respect to the gate electrode.

Hereinafter, the thermal diffusion of impurities will be described with respect to FIGS. 12 to 14.

Figure 12:
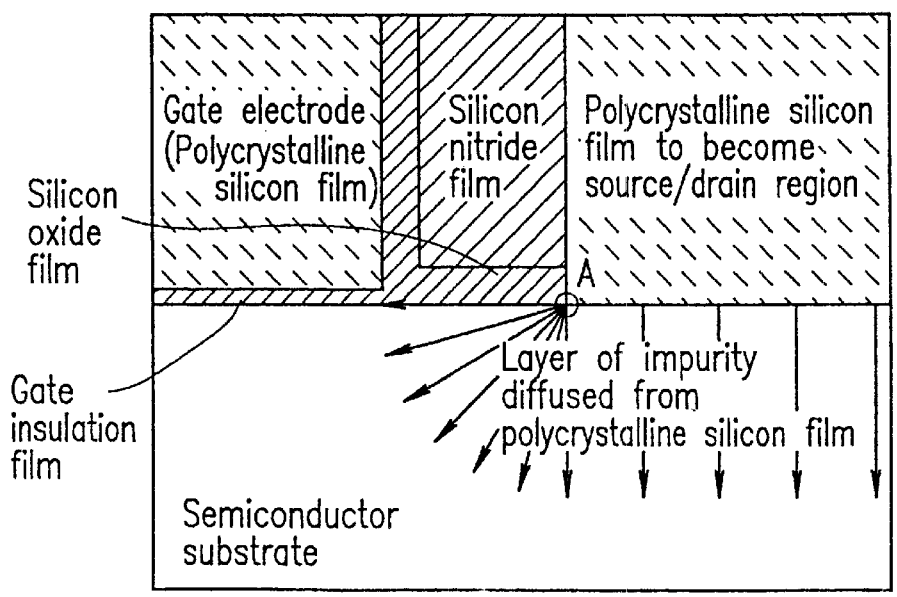
FIG. 12 is a diagram illustrating the directions in which an impurity is diffused out of a polycrystalline silicon film to become source/drain regions, into which an impurity has been implanted.

FIG. 12 is a diagram illustrating the directions in which an impurity is diffused out of a polycrystalline silicon film to become source/drain regions, into which an impurity has been implanted. As shown in FIG. 12, the impurity is diffused not only in the lower directions but also in the lateral directions (e.g., toward the left of point A).

Figure 13:
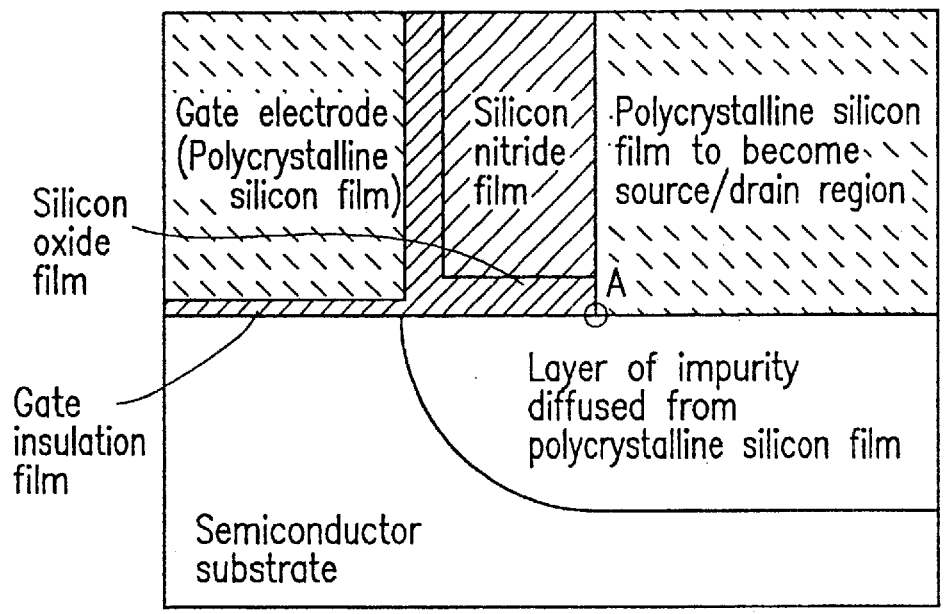
FIG. 13 is a cross-sectional view illustrating an impurity diffusion layer which results from preferable thermal diffusion.
Figure 14:
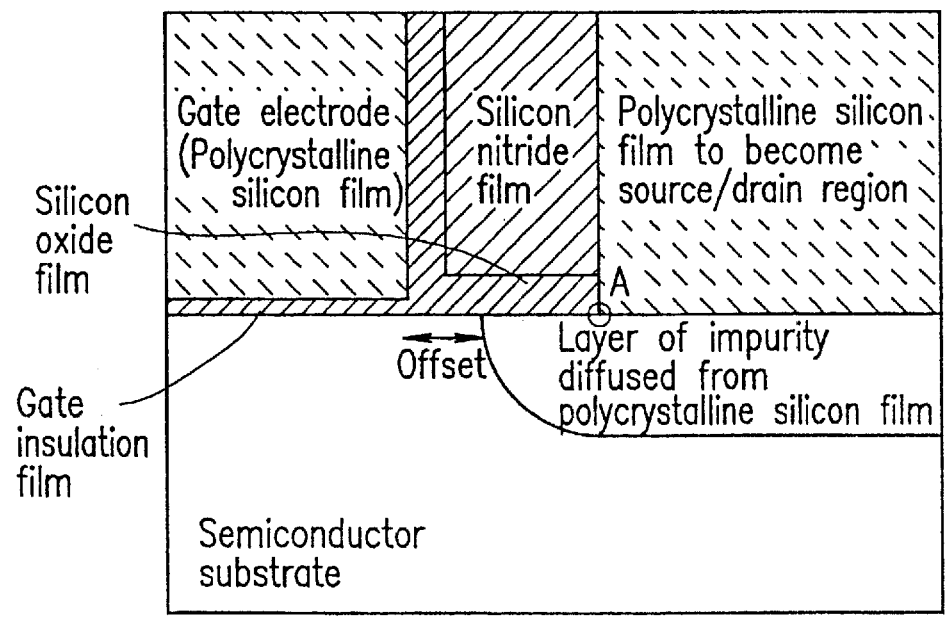
FIG. 14 is a cross-sectional view illustrating an impurity diffusion layer having an offset.

When effecting thermal diffusion of the impurity, it is preferable to allow the impurity to diffuse deep enough to prevent any offset in the lateral direction, as shown in FIG. 13. Preferably, the diffusion is effected so that the junction depth is equal to or greater than about 0.8 times the thickness of the gate electrode lateral wall insulation films; even in its deepest region (i.e., near the device separation regions), the junction depth is preferably about 2 times the thickness of the gate electrode lateral wall insulation films. FIG. 14 illustrates an impurity diffused layer having an offset with respect to the gate electrode. The driving current of a device having such an offset is greatly deteriorated.

Hereinafter, exemplary conditions for preventing or minimizing such an offset will be described.

When allowing the impurity to diffuse deep enough to prevent any offset in the lateral direction, the diffusion depth in the lower direction is uniquely defined. Therefore, in order to improve the transistor characteristics, it is necessary to reduce the thickness of the gate electrode lateral wall insulation films while ensuring that the increase in the gate electrode lateral wall capacitance does not cause a substantial increase in the overall load capacitance. In the present example, the thickness (denoted as b in FIG. 7) of each gate electrode lateral wall insulation film is prescribed as about 0.05 $\mu$m, as mentioned above.

Now, specific data concerning the short-channel effects and a heat treatment according to the present example will be described with reference to FIGS. 23 to 26.

Figure 23:
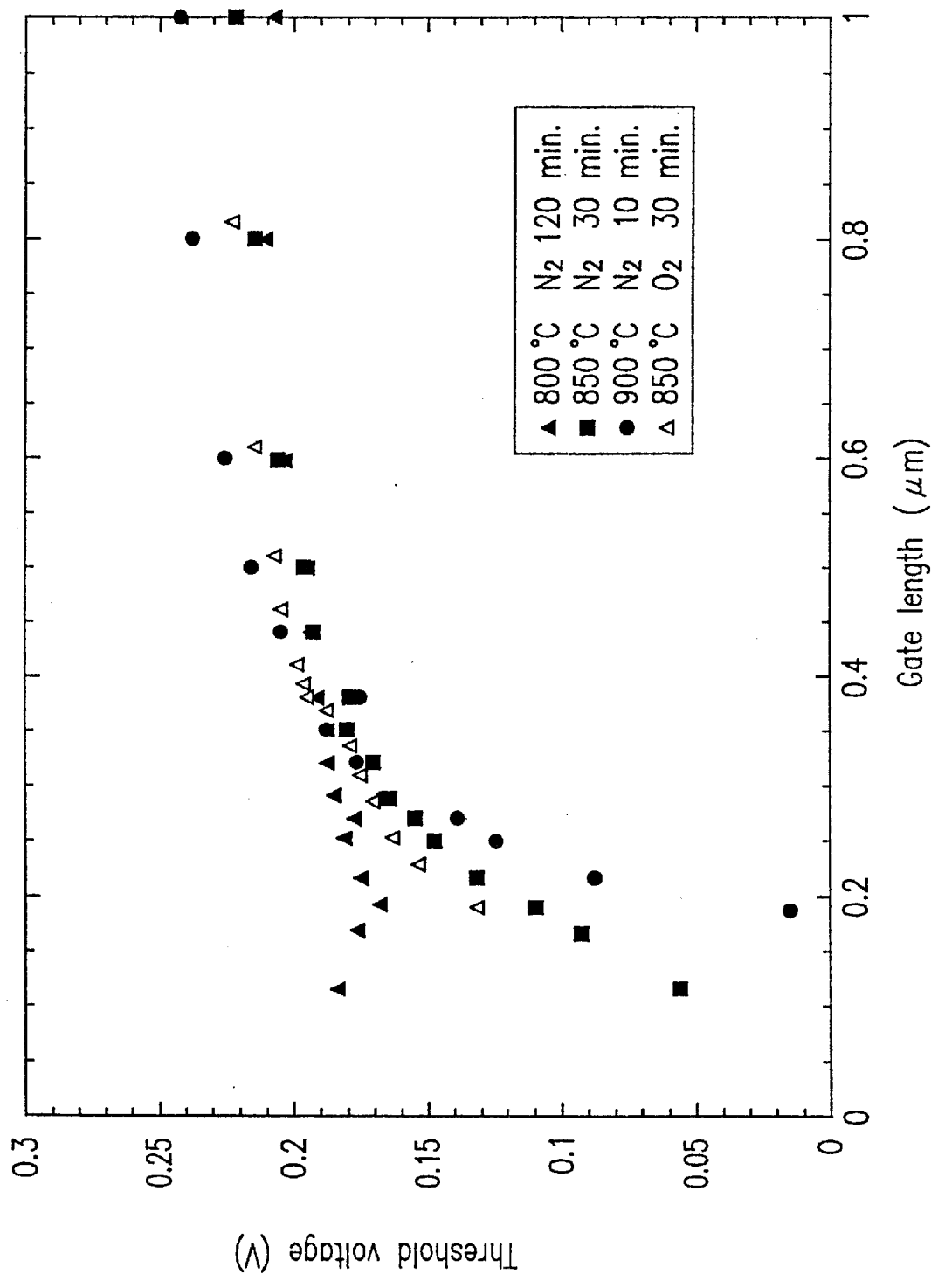
FIG. 23 illustrates data concerning N-channel transistors which were produced by implanting phosphorous ions (as an impurity for forming the source/drain regions) with an implantation energy of about 50 keV in a dose amount of about $5 \times 10^{15}/cm^2$, and performing a heat treatment under the conditions of about 800° C. (nitrogen atmosphere) for about 120 minutes; about 850° C. (nitrogen atmosphere) for about 30 minutes; about 900° C. (nitrogen atmosphere) for about 10 minutes; or about 850° C. (oxygen atmosphere) for about 30 minutes.

FIG. 23 illustrates such data concerning N-channel transistors which were produced by implanting phosphorous ions (as an impurity for forming the source/drain regions) with an implantation energy of about 50 keV in a dose amount of about $5\times10^{15}/cm^2$, and performing a heat treatment under the conditions of about 800° C. (nitrogen atmosphere) for about 120 minutes; about 850° C. (nitrogen atmosphere) for about 30 minutes; about 900° C. (nitrogen atmosphere) for about 10 minutes; or about 850° C. (oxygen atmosphere) for about 30 minutes.

Figure 24:
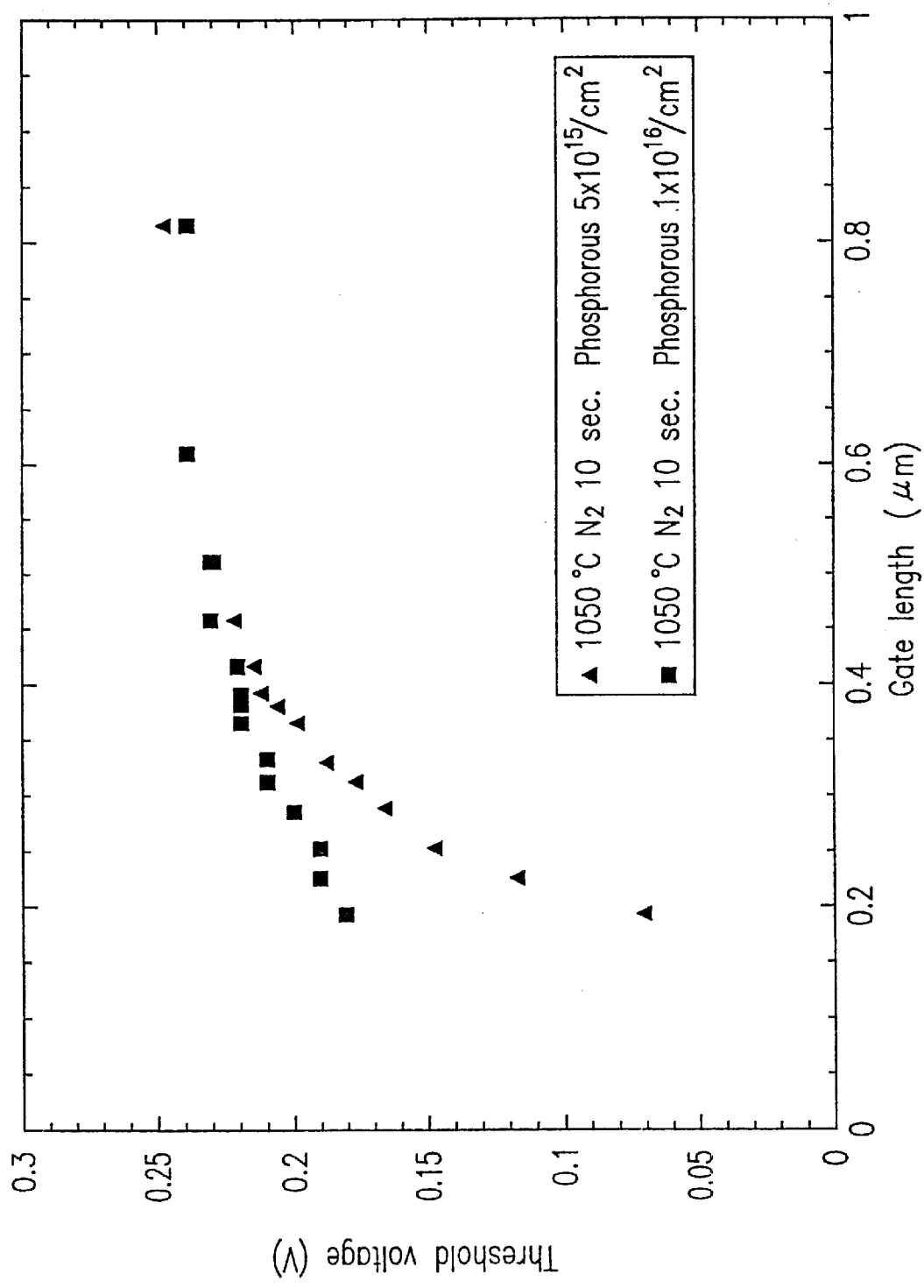
FIG. 24 illustrates such data concerning N-channel transistors which were produced by implanting phosphorous ions (as an impurity for forming the source/drain regions) with an implantation energy of about 50 keV in a dose amount of about $5 \times 10^{15}/cm^2$ or about $1 \times 10^{16}/cm^2$, followed by a rapid thermal annealing (RTA) at about 1050° C. (nitrogen atmosphere) for about 10 seconds.

FIG. 24 illustrates such data concerning N-channel transistors which were produced by implanting phosphorous ions (as an impurity for forming the source/drain regions) with an implantation energy of about 50 keV in a dose amount of about $5\times10^{15}/cm^2$ or about $1\times10^{16}/cm^2$, followed by a rapid thermal annealing (RTA) at about 1050° C. (nitrogen atmosphere) for about 10 seconds.

Figure 25:
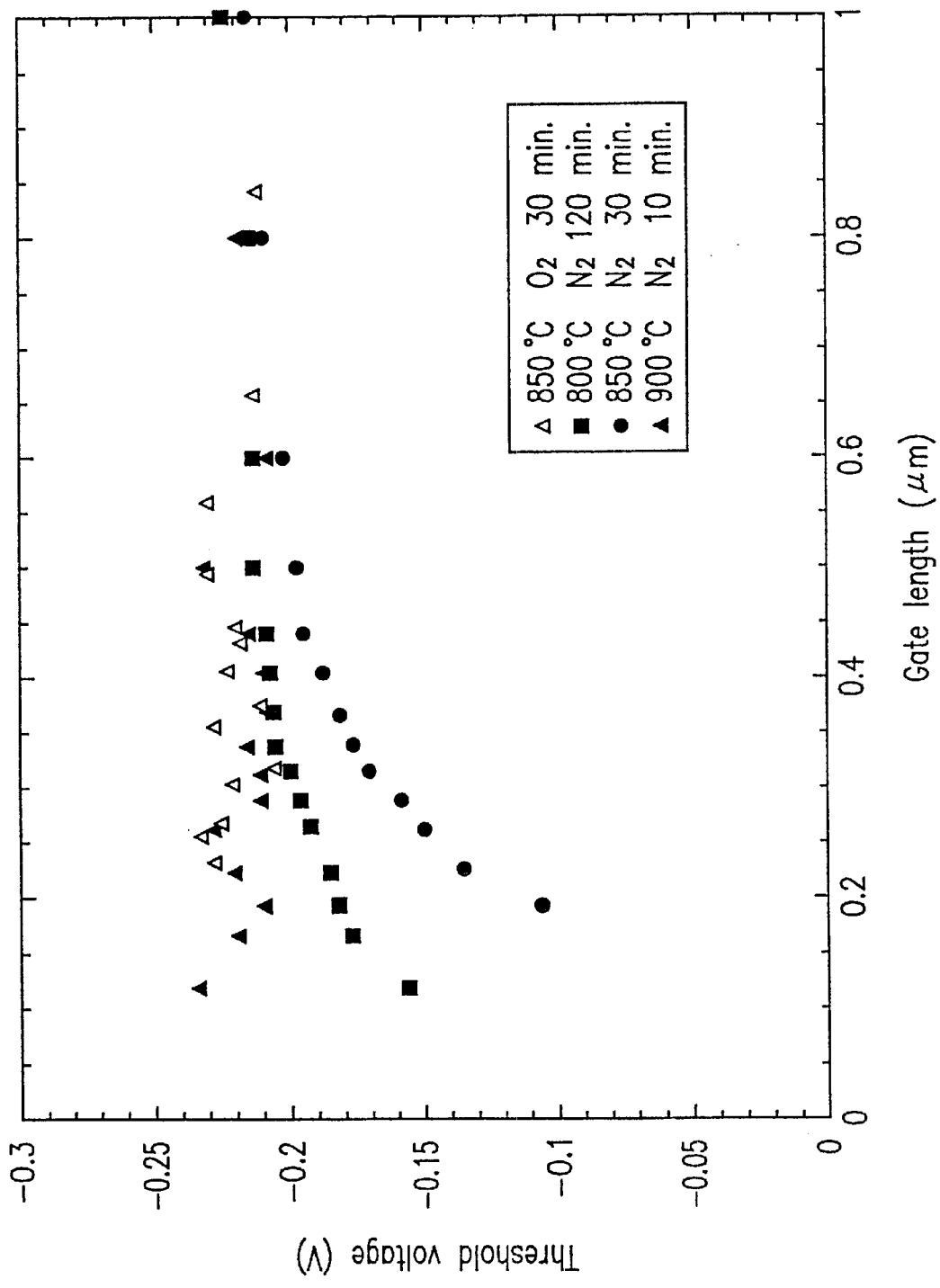
FIG. 25 illustrates such data concerning P-channel transistors which were produced by implanting boron ions (as an impurity for forming the source/drain regions) with an implantation energy of about 15 keV in a dose amount of about $5 \times 10^{15}/cm^2$, and performing a heat treatment under the conditions of about 800° C. (nitrogen atmosphere) for about 120 minutes; about 850° C. (nitrogen atmosphere) for about 30 minutes; about 900° C. (nitrogen atmosphere) for about 10 minutes; or about 850° C. (oxygen atmosphere) for about 30 minutes.

FIG. 25 illustrates such data concerning P-channel transistors which were produced by implanting boron ions (as an impurity for forming the source/drain regions) with an implantation energy of about 15 keV in a dose amount of about $5\times10^{15}/cm^2$, and performing a heat treatment under the conditions of about 800° C. (nitrogen atmosphere) for about 120 minutes; about 850° C. (nitrogen atmosphere) for about 30 minutes; about 900° C. (nitrogen atmosphere) for about 10 minutes; or about 850° C. (oxygen atmosphere) for about 30 minutes.

Figure 26:
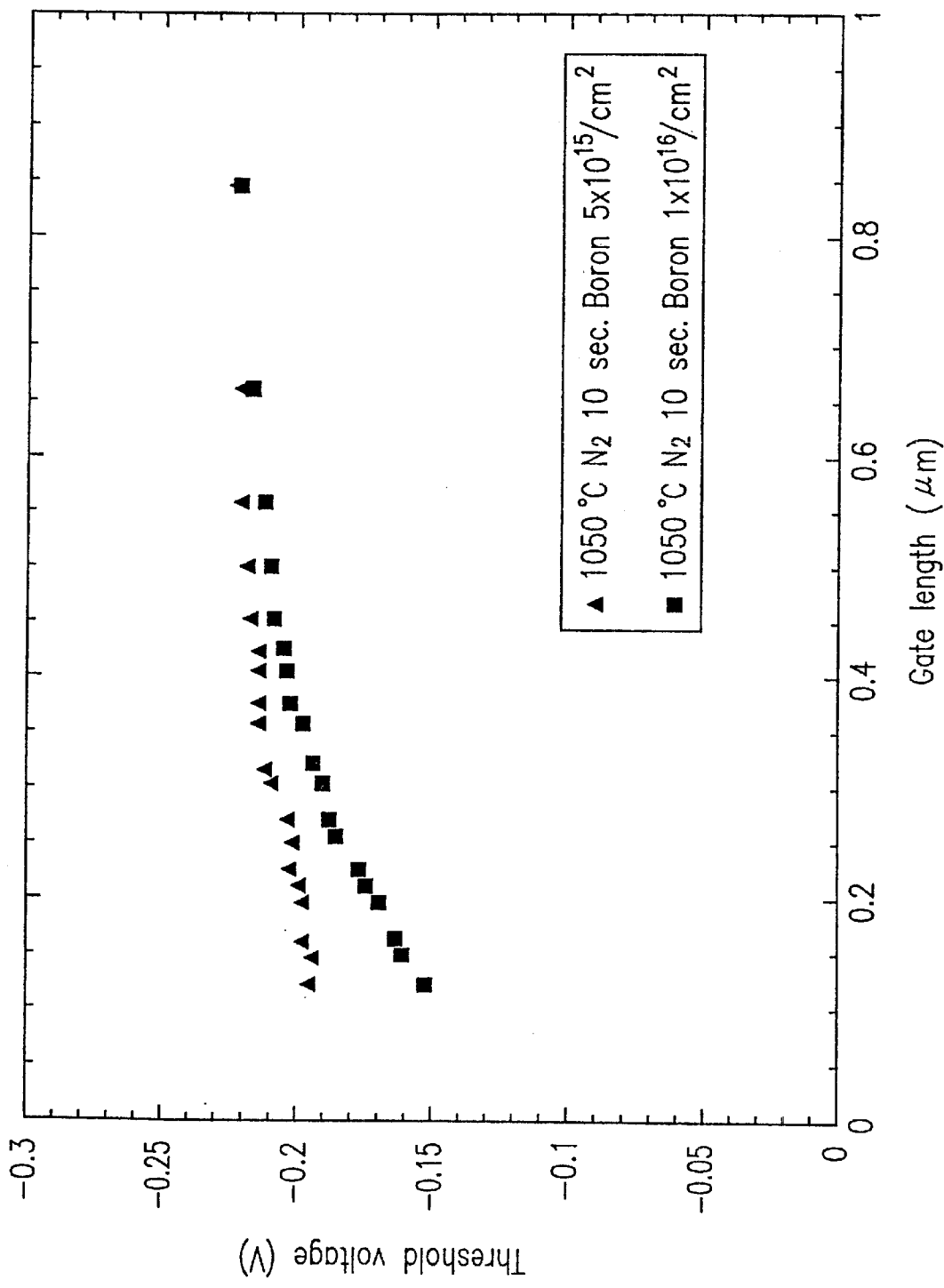
FIG. 26 illustrates such data concerning P-channel transistors which were produced by implanting boron ions (as an impurity for forming the source/drain regions) with an implantation energy of about 15 keV in a dose amount of about $5 \times 10^{15}/cm^2$ or about $1 \times 10^{16}/cm^2$, followed by a rapid thermal annealing (RTA) at about 1050° C. (nitrogen atmosphere) for about 10 seconds.

FIG. 26 illustrates such data concerning P-channel transistors which were produced by implanting boron ions (as an impurity for forming the source/drain regions) with an implantation energy of about 15 keV in a dose amount of about $5 \times 10^{15}/cm^2$ or about $1 \times 10^{16}/cm^2$, followed by an RTA at about 1050° C. (nitrogen atmosphere) for about 10 seconds.

The experimental results shown in FIGS. 23 to 26 are all directed to gate electrode lateral wall insulation films having a thickness of 0.05 μm. As seen from these results, when producing N-channel transistors (where L=about 0.24 μm) by implanting phosphorous ions with an implantation energy of about 50 keV in a dose amount of about $5 \times 10^{15}/cm^2$, an optimum heat treatment can be performed under the conditions of about 850° C. (nitrogen or oxygen atmosphere) for about 30 minutes to about 900° C. (nitrogen atmosphere) for about 10 minutes. It is seen from FIG. 23 that it is insufficient to perform a heat treatment at about 800° C. (nitrogen atmosphere) for about 120 minutes, which would result in offset transistors. When the dose amount is increased from about $5 \times 10^{15}/cm^2$ to about $1 \times 10^{16}/cm^2$, the enhanced diffusion of the highly-concentrated impurity produced excellent results with an RTA at about 1050° C. (nitrogen atmosphere) for about 10 seconds. It can also be seen that, for a dose amount of $5 \times 10^{15}/cm^2$, performing an RTA at about 1050° C. (nitrogen atmosphere) for about 10 seconds is insufficient and therefore results in the formation of offset transistors.

When producing P-channel transistors (where L=about 0.24 μm) by implanting boron ions with an implantation energy of about 15 keV in a dose amount of about $5 \times 10^{15}/cm^2$, an optimum heat treatment can be performed under the conditions of about 850° C. (nitrogen atmosphere) for about 30 minutes to about 900° C. (nitrogen atmosphere) for about 10 minutes. It is seen from FIG. 25 that it is insufficient to perform a heat treatment at about 800° C. (nitrogen atmosphere) for about 120 minutes or at about 850° C. (oxygen atmosphere) for about 30 minutes, which would result in offset transistors. When the dose amount is increased from about $5 \times 10^{15}/cm^2$ to about $1 \times 10^{16}/cm^2$, the diffusion is still insufficient for boron ions, thereby resulting in the formation of offset transistors as seen from FIG. 26.

As described above, it has been found that, in the case of transistors incorporating gate electrode lateral wall insulation films having a thickness of 0.05 μm, for either N-channel type or P-channel type transistors, an optimum heat treatment can be performed under the conditions of about 850° C. (nitrogen atmosphere) for about 30 minutes to about 900° C. (nitrogen atmosphere) for about 10 minutes in order to effect impurity diffusion through a single heat treatment.

The present example is a mere illustration of exemplary parameter values satisfying conditions a>b+c and d>a+c that were available to the inventors under the F=0.24 μm rule, and by no means is restrictive of the scope of the invention. For example, the respective values of a, b, c, and d will be different under the smaller F=0.1 μm rule. For that matter, a, b, c, and d may take different values that satisfy the conditions a>b+c and d>a+c under the F=0.24 μm rule. In this connection, the values of the thickness f of the gate electrode lateral wall insulation film and the maximum height g of the source/drain regions near the gate electrode may vary in accordance with the values of a, b, c, and d, and are by no means restricted to the values disclosed in the present example. The ion species to be implanted, implantation energy, dose amount, and heat treatment conditions should be optimized in accordance with the specific values of a, b, c, d, f, and g. Since the doping of the gate electrode and the formation of the source/drain regions according to the present example are achieved by simultaneous implantation, care should be taken in performing such ion implantation and heat treatment as to the following points. Namely, it is essential to achieve the aforementioned transistor characteristics (prevention of short-channel effects and improvement in the driving current) while satisfying the conditions for preventing depletion of the gate electrode in the vicinity of the gate insulation film and preventing penetration of the impurity into the channel region (which is naturally subject to the thickness f of the polycrystalline silicon film). It would seem very difficult to obtain optimum conditions because of the manner in which the respective parameters interact with one another. However, the present invention successfully achieves very large processing condition margins by prescribing a diffusion coefficient of the stacked layers at a relative large value as compared to the diffusion coefficient of the silicon substrate (monocrystalline silicon). In other words, by first prescribing the values of a, b, c, and d so as to improve the driving current and prevent the short-channel effects while minimizing the area occupied by the device without making it impossible to process the device, some margins can be allowed for process conditions such as the f value, the g value, ion implantation, and the heat treatment.

Hereinafter, the reason why the present example is superior to methods which form stacked diffusion layers from an epitaxial silicon film will be described.

As described above, in accordance with the structure of the present invention (as well as the conventional structure including stacked diffusion layers formed of an epitaxial silicon film) where an impurity is diffused by a solid phase diffusion method from a stacked layer to form a shallow source/drain junction, the conditions for performing the ion implantation, heat treatment, and the like may vary depending on the height of the gate electrode, the height of the stacked regions, the thickness of the gate electrode lateral wall insulation films, etc. In accordance with the present example where the stacked layers are formed of a polycrystalline silicon film, the diffusion coefficient of the impurity can be increased so as to be about 10 to 100 times as large as that of silicon monocrystalline film (note that the diffusion coefficient increases as the grain size of the polycrystalline silicon film decreases). In other words, a large margin can be allowed for the ion implantation and heat treatment.

However, in a conventional example where stacked layers are formed of epitaxial silicon films, the diffusion coefficient of the gate polycrystalline silicon film greatly differs from that of the stacked layers. Therefore, it is impossible in accordance with such conventional techniques to prescribe conditions for achieving the aforementioned transistor characteristics (prevention of short-channel effects and improvement in the driving current) while satisfying conditions for preventing the depletion of the gate electrode in the vicinity of the gate insulation film and penetration of the impurity into the channel region.

In other words, the impurity diffusion within the gate polycrystalline silicon film occurs more readily than the impurity diffusion within the stacked layers and the semiconductor monocrystalline substrate. Accordingly, if diffusion is effected under conditions for preventing an offset configuration of the transistor, then boron ions will penetrate through the gate oxidation film. On the other hand, if diffusion is effected under conditions for preventing the penetration of boron ions, then the resultant transistor will have an offset configuration.

Even in the case where simultaneous doping for the gate electrode is not performed, the technique of forming source/drain regions by diffusing an impurity from a polycrystalline silicon film into a monocrystalline silicon (i.e., the semiconductor substrate) through thermal diffusion provides the following advantages: the impurity diffuses quite rapidly to the interface between the active region surface of the semiconductor substrate and the deposited polycrystalline silicon film due to the large difference in the diffusion coefficients thereof.

On the other hand, the diffusion from the interface into the silicon substrate proceeds slowly due to the small difference in the diffusion coefficients thereof. As a result, the variation in the height of the stacked layers and the variation in the projected range (Rp) during impurity ion implantation can be minimized, thereby realizing a uniform source/drain region junction depth.

On the other hand, in the case where a monocrystalline epitaxial silicon film is grown in the active region, the diffusion coefficient of the impurity within stacked monocrystalline epitaxial silicon and the diffusion coefficient within the semiconductor substrate are substantially equal, so that the variation in the height of the stacked layers and the variation in Rp during impurity ion implantation result in variation in the source/drain region junction depth and hence variation in the transistor characteristics.

In the case where simultaneous doping for the gate electrode is not performed, a method described in Example 4 (described later) or a method of employing phosphorous diffusion for doping with an impurity of the same conductivity type for all of the gates can be used, for example. It will be appreciated that the resultant P-channel transistor in the latter case will be a buried channel type transistor.

According to the present invention, there is also an advantage in that the active region is not susceptible to damage because the ion implantation is not directly performed for the active region.

Figure 8E:
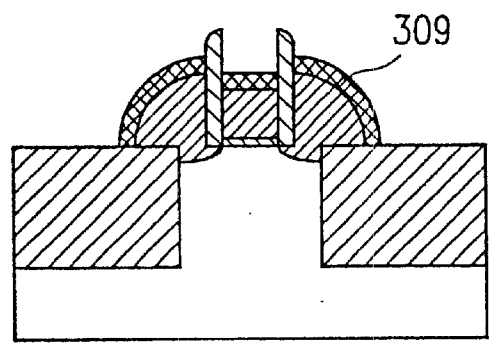

As shown in FIG. 8E, a refractory metal silicide film 309 is selectively formed above the source, drain, and gate electrodes by using a well-known salicide process. Although the present example contemplates titanium as the refractory metal film, there is no limitation as to the kind of refractory metal. For example, Co, Ni, Pt, or the like may be used as the refractory metal. In the present example, the entire upper surface of the source, drain, and gate electrodes is converted into a salicide.

Figure 8F:
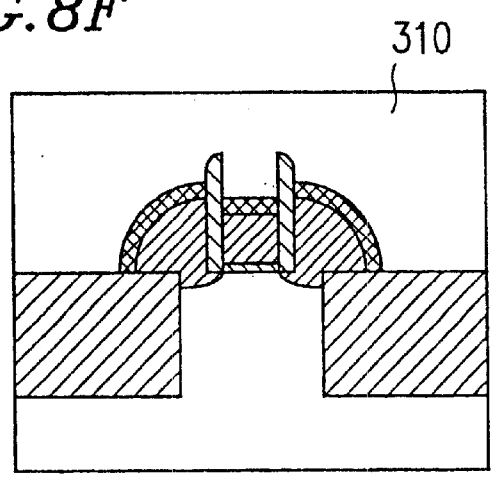

Then, as shown in FIG. 8F, an interlayer insulation film 310 is formed by a well-known method.

Figure 8G:
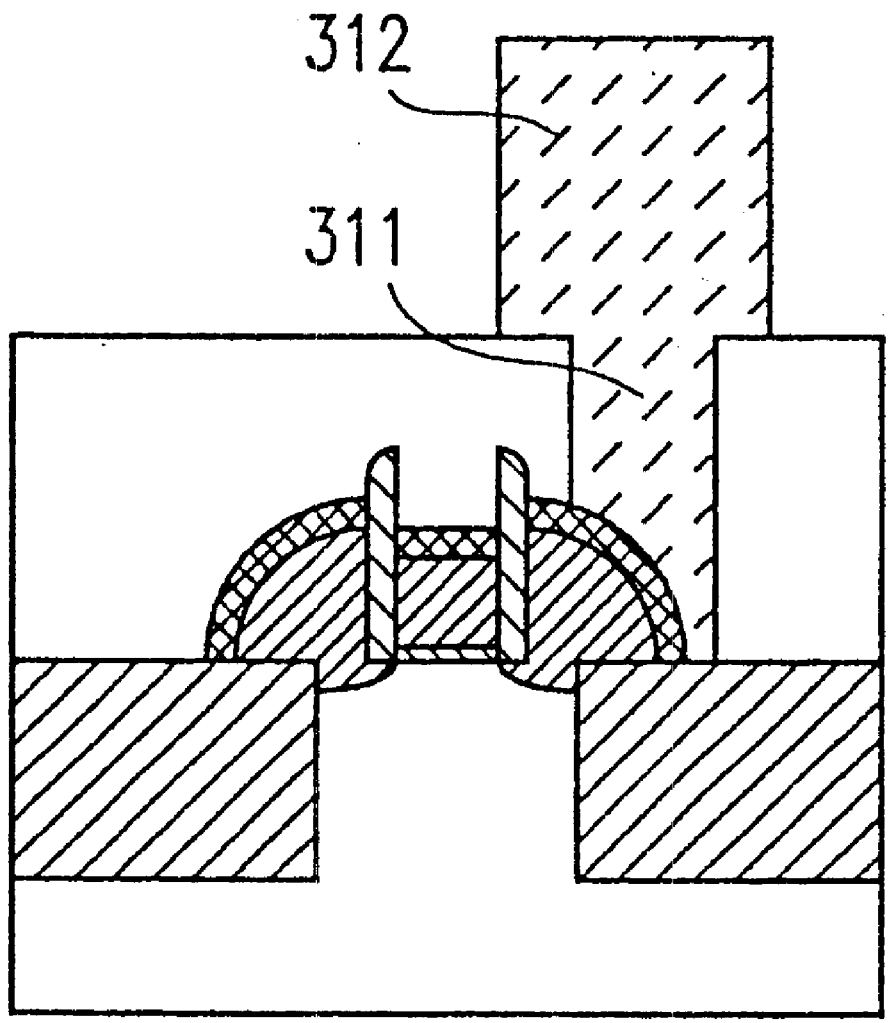

Next, as shown in FIG. 8G, a contact hole 311 is formed in a predetermined position in the interlayer insulation film 310, and thereafter upper wiring 312 is formed. In the present example, each contact hole 311 only needs to at least partially overlap a corresponding source/drain region as shown in FIG. 8G. By employing such a configuration, the area occupied by the device can be greatly reduced.

Since source/drain regions each having a relatively large surface area as compared to the area which they occupy are formed so as to be stacked above the channel region in accordance with the present example, a large contact area is secured between the contact holes 311 and the source/drain regions even if each contact hole 311 only partially overlaps the corresponding source/drain region. As a result, the contact resistance is prevented from increasing while reducing the junction area of the source/drain regions.

Figure 15:
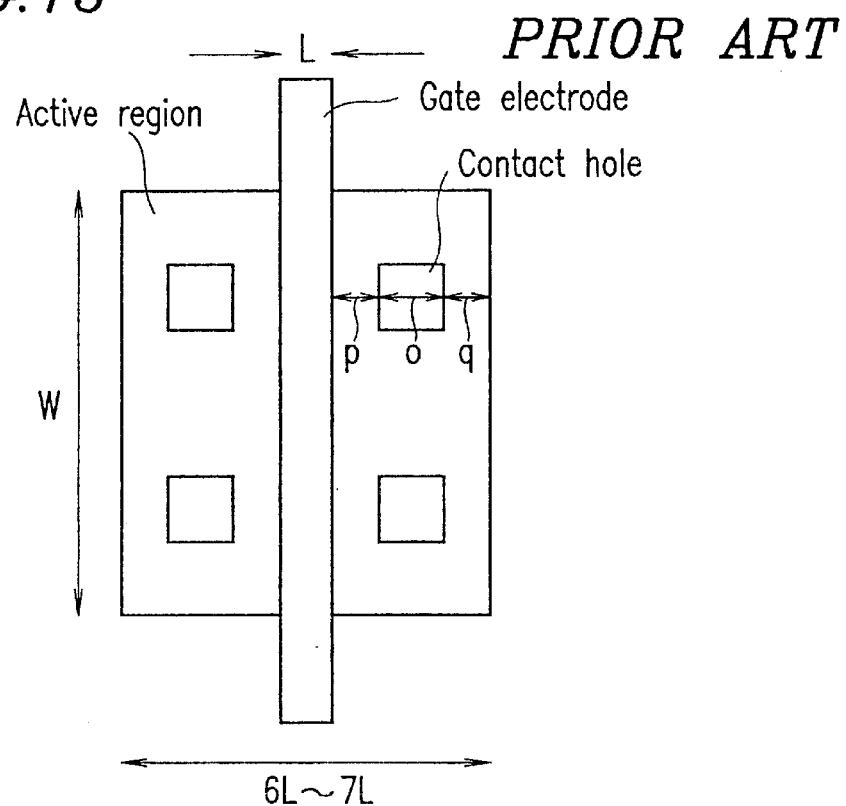
FIG. 15 is a plan view of a semiconductor substrate, illustrating the relationship between a gate electrode, an active region, and contact holes.

FIG. 15 is a plan view of a conventional semiconductor substrate. The transistor device shown in FIG. 15 has a gate length L (note that the gate length L usually equals the minimum processing dimension F) and a gate width W. Conventionally, a margin of about 2.5L to 3L is required between a gate electrode and a device separation region: this margin is a sum of a width o of the contact hole aperture, an alignment margin p (for preventing short-circuiting between upper wiring in the contact hole and the gate electrode) and an alignment margin q (for preventing short-circuiting between the contact and the semiconductor substrate or well region). Thus, the active region of the transistor shown in FIG. 15 occupies an area in the range from (2.5L×2+L)×W to (3L×2+L)×W, i.e., 6 LW to 7 LW.

Figure 16:
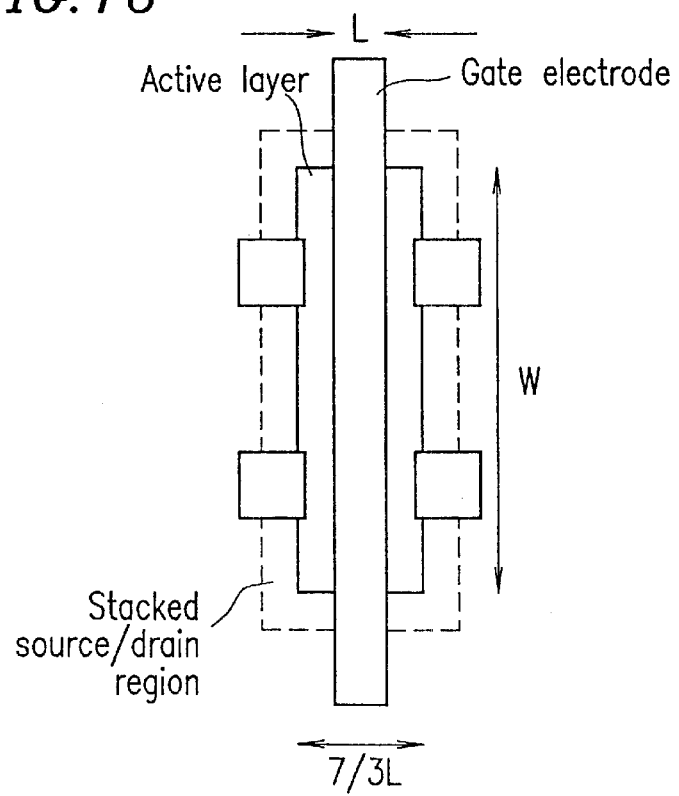
FIG. 16 is a plan view showing a semiconductor substrate produced in accordance with an embodiment of the present invention.

FIG. 16 is a plan view showing a semiconductor substrate produced in accordance with the present example. The margin between the gate electrode and the device separation region in FIG. 16 only needs to be about 2/3 L. (In FIG. 7, a=0.16 μm assuming that F=0.24 μm). The area occupied by the active region according to the present example is (2/3 L×2+L)×W=7/3 LW. Thus, the area occupied by the active region according to the present example is about 7/18 to 1/3 times smaller than the area occupied by the active region in the conventional structure shown in FIG. 15 per device.

Moreover, the junction parasitic capacitance according to the present example can be reduced to about 4/15 to 2/9 times that of the conventional device shown in FIG. 15. However, the area which is occupied by an LSI that is produced in accordance with the present example may not be reduced to 7/18 to 1/3 times that of a conventional LSI because of wiring pitch constraints, contact pitch constraints, and other constraints which the entire LSI will be subject to.

EXAMPLE 4

Hereinafter, a method for producing a semiconductor device according to Example 4 of the present invention will be described.

FIGS. 17A to 17G show respective steps of a process of manufacturing a semiconductor device according to the present example. The gate electrode according to the present example is formed of a refractory metal, a polycrystalline silicon film, or the like.

Figure 17A:
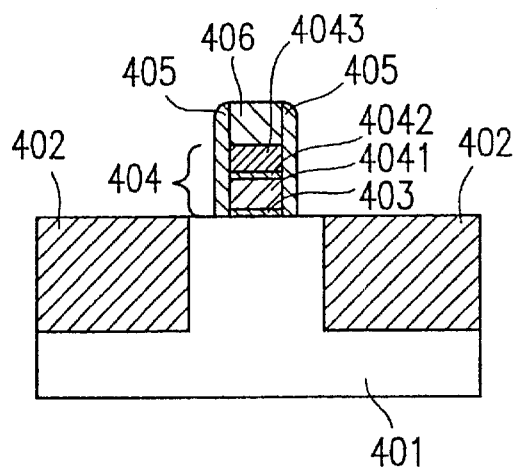
FIGS. 17A to 17G show respective steps of a process of manufacturing a semiconductor device according to the present invention.

As shown in FIG. 17A, a known method is employed to form device separation regions 402, a gate oxide film 403, a gate electrode 404, and gate electrode lateral wall insulation films 405 on a semiconductor substrate 401, or a well region provided therein. The gate electrode 404 is formed so as to have a three-layer structure including a titanium nitride film 4042 interposed between a polycrystalline silicon film 4041 and a tungsten film 4043.

The titanium nitride film 4042 is employed so as to prevent the polycrystalline silicon film 4041 and the tungsten film 4043 from reacting with each other in a subsequent heat treatment. If the polycrystalline silicon film 4041 and the tungsten film 4043 react with each other, a tungsten silicide film is formed, thereby increasing the resistance of the gate electrode 404.

The polycrystalline silicon film 4041 in the gate electrode 404 is previously doped with boron ions in the case of a P-channel transistor, and phosphorous ions in the case of an N-channel transistor.

On the gate electrode 404, an insulation film 406 is formed which is composed essentially of a silicon oxide film or a silicon nitride film. Each of the gate electrode lateral wall insulation films 405 formed on the sides of gate electrode 404 is composed essentially of a two-layer film including a silicon oxide film and a silicon nitride film.

The semiconductor device according to the present example is designed by using an F=0.18 μm rule. The respective dimension parameters are prescribed as follows: a=about 0.12 μm; b=about 0.03 μm; c=about ±0.06 μm; and d=about 0.25 μm, where a represents the distance from the gate electrode 404 to each device separation region 402; b represents the thickness of each gate electrode lateral wall insulation film; c represents an alignment margin for aligning the gate electrode 404 with respect to each device separation region 402; and d represents the width of each side wall (FIG. 17C). By using the aforementioned values for parameters a to d, the height of the gate electrode 404 including the insulation film 406 thereon is about 200 to about 300 nm.

Figure 17B:
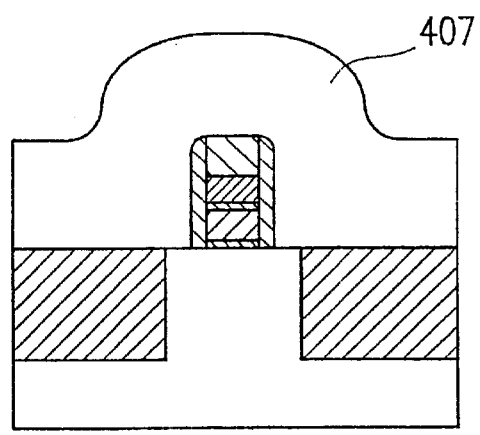
Figure 17C:
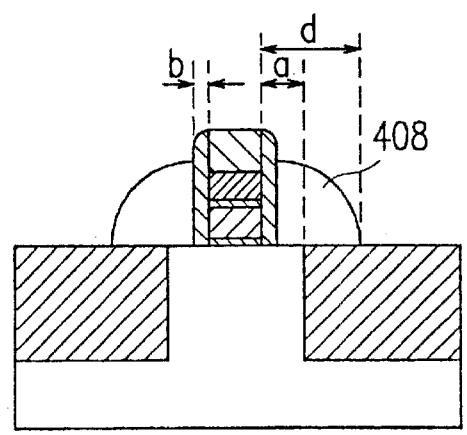

As in Example 3, the polycrystalline silicon film 407 is deposited by a chemical vapor deposition (CVD) method (FIG. 17B). In the present example, it is assumed that the polycrystalline silicon film 407 is deposited to a thickness of about 300 to about 400 nm.

The polycrystalline silicon film 407 is etched back (FIG. 17C) under the same etching back conditions as in Example 3. Merely performing an etch-back process leaves the polycrystalline silicon film 408 around the gate electrode 404 with the gate electrode lateral wall insulation films 405 interposed therebetween. Now, in order to utilize the polycrystalline silicon film 408 as stacked source/drain regions, it is necessary to separate the source/drain regions. In the present example, the etching may be performed so as to allow a degree of side etching to ensure that the source/drain regions are securely separated even in the case where the gate electrode lateral walls are not substantially perpendicular with respect to the substrate surface.

Figure 17D:
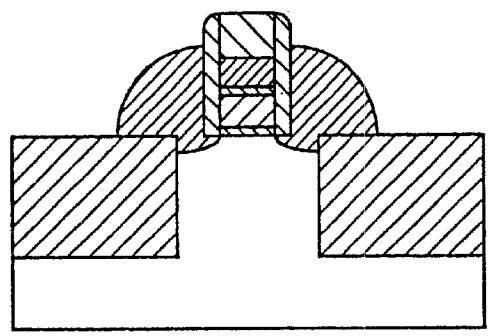

As shown in FIG. 17D, impurity ions are implanted to form the source/drain regions. According to the present example, unlike in Example 3, only the doping for the regions to become the source/drain regions is performed when forming the source/drain regions. Otherwise the same implantation conditions, heat treatment conditions, and the like as in Example 3 are employed.

Figure 17E:
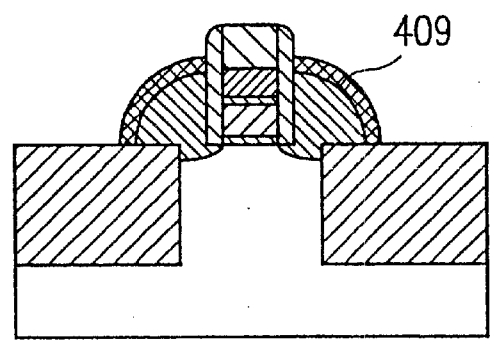

As shown in FIG. 17E, a refractory metal silicide film 409 is selectively formed above the source/drain regions by using a well-known salicide process. Although the present example contemplates titanium as the refractory metal film, there is no limitation as to the kind of refractory metal. For example, Co, Ni, Pt, or the like may be used as the refractory metal.

In the present example, the gate electrode 404 is formed of tungsten which has a lower resistance than that of a metal silicide film, and a silicon oxide film or a silicon nitride film is present above the gate electrode 404. Accordingly, only the surface of the source/drain regions is converted into a silicide.

Figure 17F:
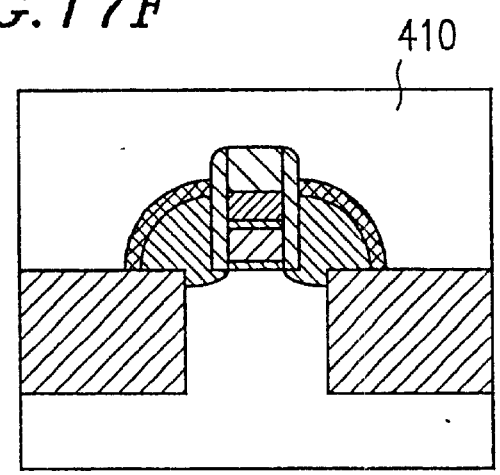

Then, as shown in FIG. 17F, an interlayer insulation film 410 is formed by a well-known method.

Figure 17G:
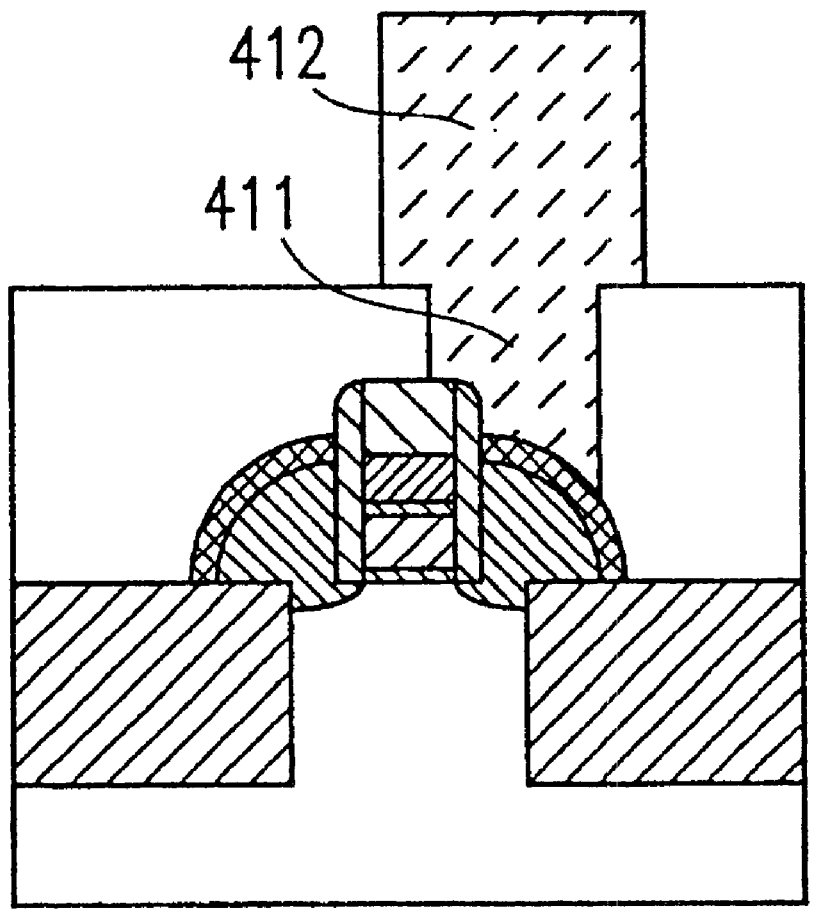

Next, as shown in FIG. 17G, a contact hole 411 is formed in a predetermined position in the interlayer insulation film 410, and thereafter upper wiring 412 is formed on the interlayer insulation film 410 and/or in the contact hole 411. In the present example, each contact hole 411 only needs to at least partially overlap a corresponding source/drain region as shown in FIG. 17G. By employing such a configuration, the area occupied by the device can be greatly reduced.

According to the present example, the insulation film 406 is present on the gate electrode 404. Therefore, even if the contact hole 411 partially overlaps the gate electrode 404, the source/drain region is prevented from being short-circuited with the gate electrode 404 via the conductor disposed in the contact hole 411. As a result, the present example can provide more designing flexibility with respect to the locations of the contact holes than does Example 3.

As a result, it is unnecessary to provide any margin (including alignment margins) for preventing short-circuiting between the upper wiring in the contact hole 411 and the gate electrode 404 according to the present example. Specifically, different materials may be employed for the interlayer insulation film 410 and the insulation film 406 on the gate electrode 404, and an etching process which provides an etching selection ratio between the material of the interlayer insulation film 410 and the material of the insulation film 406 on the gate electrode 404 may be employed to etch the interlayer insulation film 410 to create the contact hole 411.

For example, in the case where the insulation film 406 on the gate electrode 404 is a silicon nitride film and the interlayer insulation film 410 is a silicate glass or the like containing boron and phosphorous, an etching selection ratio from 1:10 to over 1:100 can be provided for the silicon nitride film 406 and the silicate glass film 410 containing boron and phosphorous by employing a fluorocarbon type gas. By forming the contact hole 411 through such etching, the gate electrode 404 can be prevented from being exposed.

The selection ratio consideration for the aforementioned contact hole etching also applies to the relationship between the device separation regions and the interlayer insulation film.

Specifically, the contact holes 411 are partially in contact with the device separation regions in Example 3 and the present example. If there is no substantial difference between the etching rate of the material for the interlayer insulation film 410 and that of the material for the device separation regions, a recess may be etched into the device separation regions during the contact hole etching. In order to circumvent this problem, it is preferable to employ a material (e.g., silicon nitride film) which provides a certain etching selection ratio relative to the interlayer insulation film 410 for at least the superficial portion of the insulation film composing the device separation regions.

It is preferable that the grain size of the stacked layers of polycrystalline silicon films according to Example 3 and the present example be sufficiently small relative to the area occupied by the source/drain regions. As described in Example 3, in order to provide large process margins (margins for the impurity ion implantation conditions, heat treatment conditions, etc. for forming the source/drain regions) so as to prevent variation in the transistor characteristics, it is preferable that the diffusion coefficient of the stacked layers of polycrystalline silicon films with respect to the silicon substrate is sufficiently large (preferably 10 times or more of the diffusion coefficient within monocrystalline silicon).

The diffusion of a given impurity within a polycrystalline silicon film is more enhanced as more grain boundaries are present in the film. In other words, it is necessary to employ a grain size which is sufficiently small relative to the area occupied by the source/drain regions. The grain size of the polycrystalline silicon film is preferably about 50 nm or less because the margin between the gate electrode and the device separation region is only about 0.16 μm even under the relatively large F=0.24 μm rule. It is also preferable that the grains are columnar crystals because they would greatly increase the rate of downward diffusion toward the silicon substrate.

According to Example 3 and the present example, polycrystalline silicon films are used as the material forming the stacked source/drain regions. Other suitable materials include silicon germanium (polycrystalline) films and the like. A single layer amorphous film of silicon or silicon germanium ($Si_xGe_y$) or a two-layer film of amorphous and polycrystalline materials may be employed to form the stacked source/drain regions. When silicon germanium is used, an improved impurity activation rate is provided as compared to the case of using silicon.

EXAMPLE 5

Hereinafter, an exemplary configuration of the semiconductor device according to the present invention in which an SOI (silicon on insulator) substrate is employed as a substrate will be described with reference to FIG. 18.

FIG. 18 is a cross-sectional view illustrating the semiconductor device according to the present example, taken along a direction (X–X') which is perpendicular to the longitudinal direction of a gate electrode 507 of the semiconductor device.

The semiconductor device shown in FIG. 18 is formed on an SOI substrate 501; an oxide film 502 formed on the SOI substrate 501; an active region 503; a body region 504; device separation regions 505; a gate oxide film 506; a gate electrode 507; a gate electrode lateral wall insulation film 508; source/drain regions 509; refractory metal silicide films 510; an interlayer insulation film 511; and a contact hole 512.

The surface of each source/drain region 509, i.e., the face in which the contact hole 512 is made for coupling with upper wiring (not shown) and/or which is in contact with the interlayer insulation film 511, exhibits a curved and/or slanted profile as in Examples 1 to 4. Moreover, in accordance with the semiconductor device shown in FIG. 18, silicon (polycrystalline silicon film) which is stacked above the channel region is present on the SOI substrate 501. Therefore, in the salicide process, the surface of the silicon film which is stacked above the channel region reacts with the refractory metal to form a silicide film. As a result, the silicide film is prevented from reaching the oxide film 502 in the SOI substrate 501.

On the contrary, in a semiconductor device incorporating a conventional SOI substrate, the thickness of the silicon film on the oxide film is generally made extremely small in order to achieve full depletion of the body region. However, a smaller thickness of the silicon film results in a higher resistance of the source/drain regions. This problem would seem to be solvable by converting the source/drain region surface into a silicide and forming a refractory metal silicide film. However, due to the small silicon film thickness, the silicide film would reach the silicon oxide film underlying the silicon film, thereby deteriorating the transistor characteristics.

As described above, in accordance with the present example, the silicide film is prevented from reaching the oxide film 502 in the SOI substrate 501, so that the deterioration of the transistor characteristics due to silicide formation is prevented.

EXAMPLE 6

Examples 1 and 5 are indifferent to the relationship between the distance between two adjoining gate electrodes and the side wall width d. In Example 6, a semiconductor device is described with reference to FIGS. 19A, 19B, 20, and 21, in which the distance between two adjoining gate electrodes is smaller than two times the side wall width d.

Figure 19A:
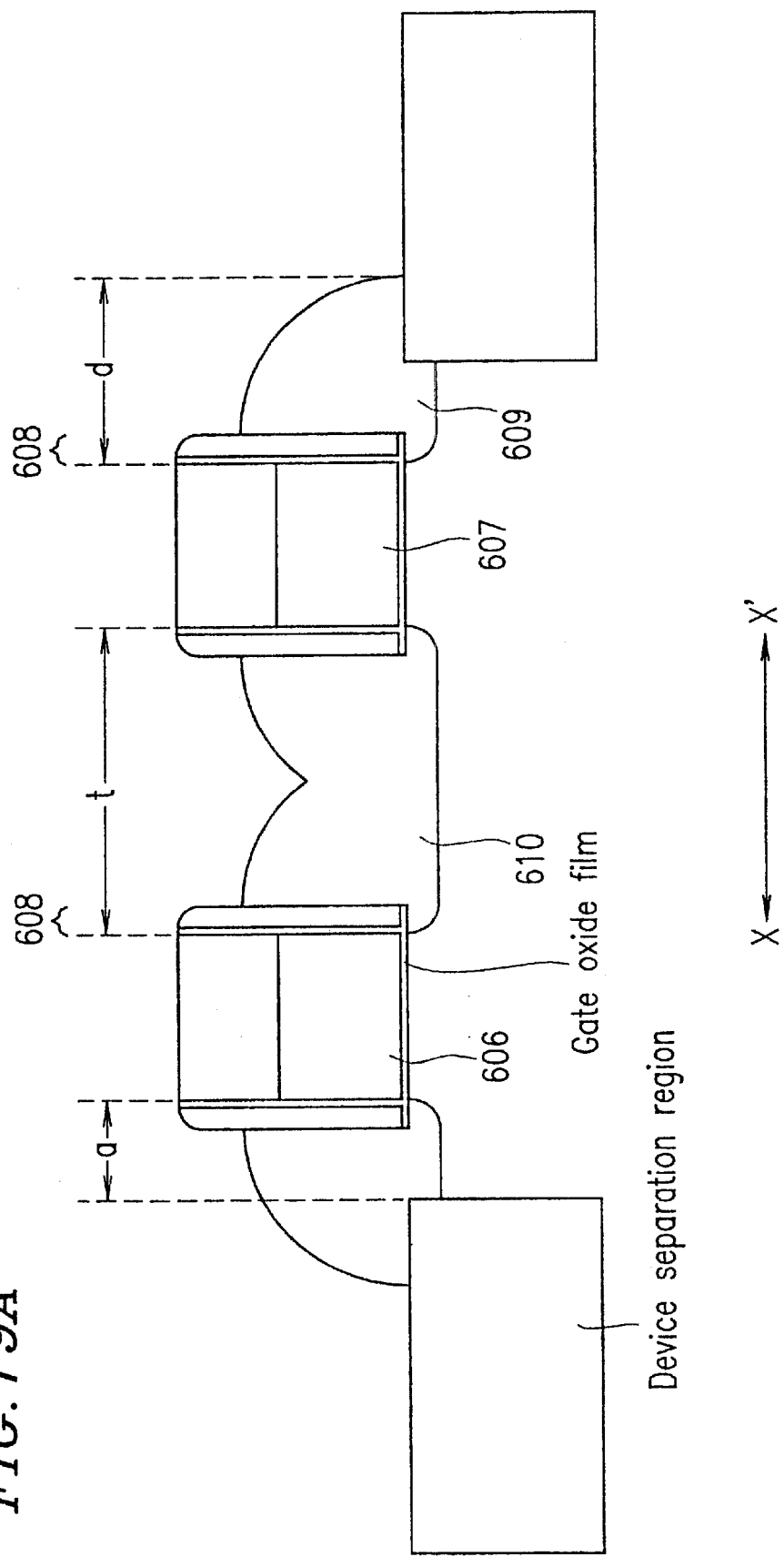
FIG. 19A is across-sectional view illustrating a semiconductor device in which the distance between two adjoining gate electrodes is shorter than two times the side wall width d, taken along a direction (X–X') which is perpendicular to the longitudinal direction of gate electrodes of the semiconductor device.

FIG. 19A is a cross-sectional view illustrating a semiconductor device in which the distance t between two adjoining gate electrodes is smaller than two times the side wall width d, taken along a direction (X–X') which is perpendicular to the longitudinal direction of gate electrodes of the semiconductor device (2d>t).

Device separation regions are formed on a semiconductor substrate, or a well region provided therein. The device separation regions are formed of a material which withstands silicon etching. Next, a gate oxidation film, gate electrodes 606 and 607, and gate electrode lateral wall insulation films 608 are formed in this order so that the distance between the adjoining gate electrodes 606 and 607 is smaller than two times the width d of each side wall (i.e., the source/drain region 609), i.e., 2d>t. The distance between the gate electrode and each device separation region along the direction (i.e., the "gate length direction") (X–X') which is perpendicular to the longitudinal direction of the gate electrodes 606 and 607 is denoted as a in FIG. 17A.

Next, a polycrystalline silicon film is deposited by a CVD method so as to be thicker than the distance a. An anisotropic etching is performed until the polycrystalline silicon film above the gate electrode is substantially etched away. The remainders of the polycrystalline silicon film are left on the sides of the gate electrode lateral wall insulation films 608 in the fashion of side walls. However, as shown in FIG. 19A, a region including overlapping source/drain regions is formed between the two adjoining gate electrodes 606 and 607.

Figure 19B:
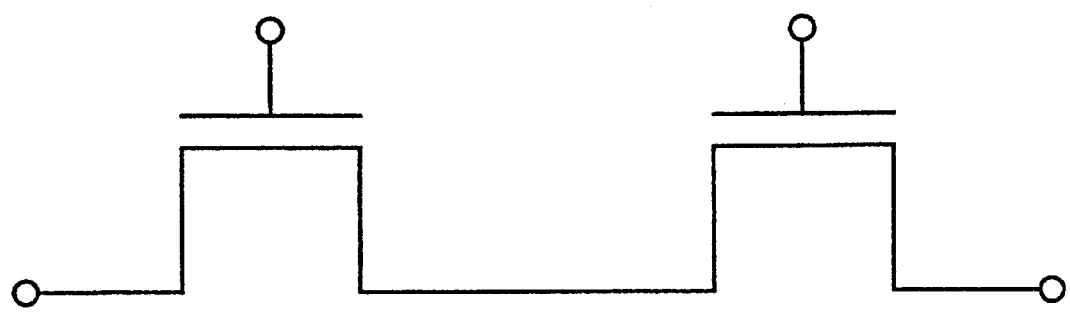
FIG. 19B shows an equivalent circuit of the semiconductor device of Example 6 of the present invention.
Figure 20:
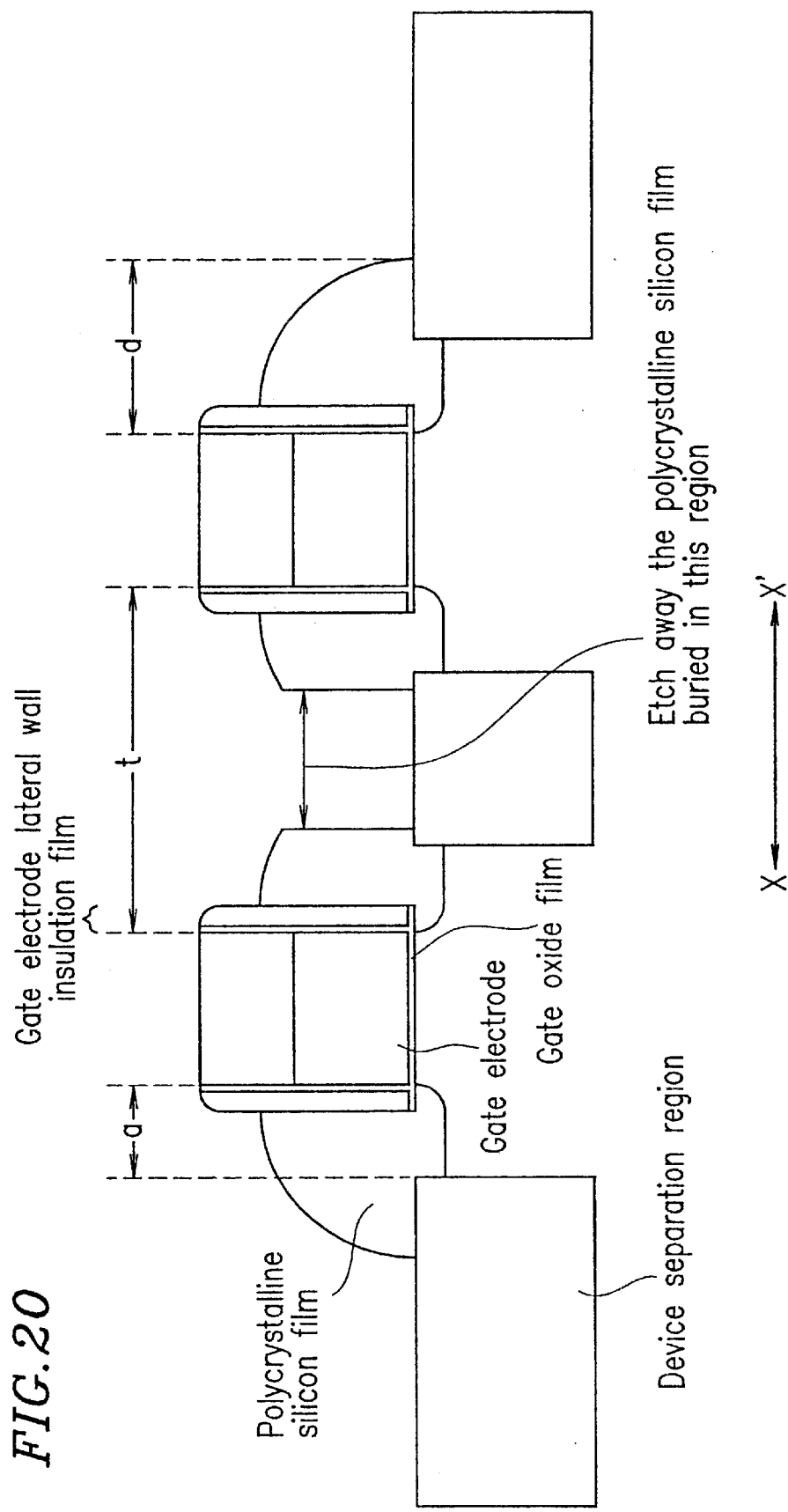
FIG. 20 is a cross-sectional view illustrating a semiconductor device according to Example 6 of the present invention, taken along a direction (X–X') which is perpendicular to the longitudinal direction of its gate electrode.
Figure 22A:
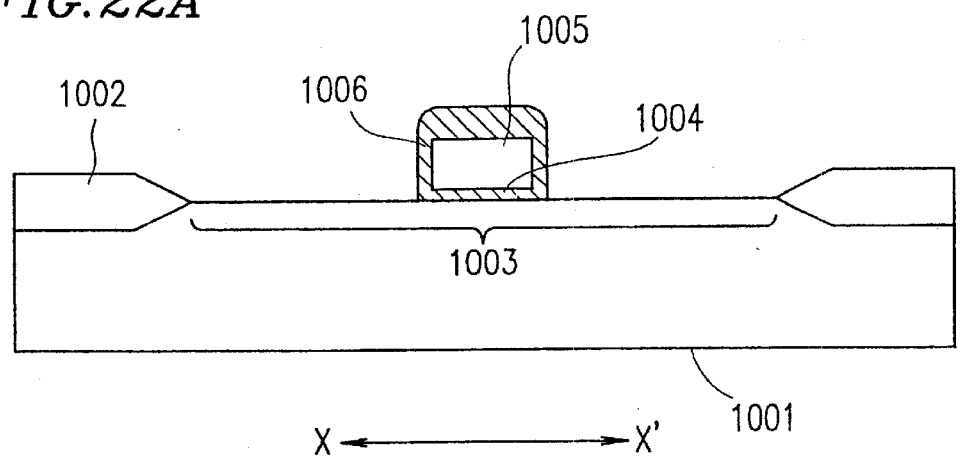
FIGS. 22A, 22B, and 22C are cross-sectional views illustrating steps of a conventional method for forming stacked diffusion layers.
Figure 22B:
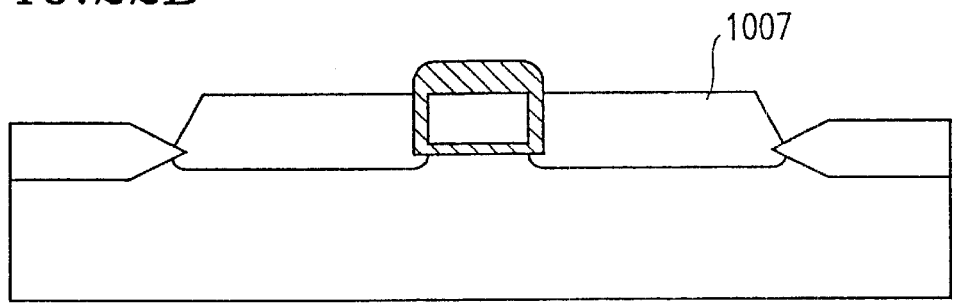
Figure 22C:
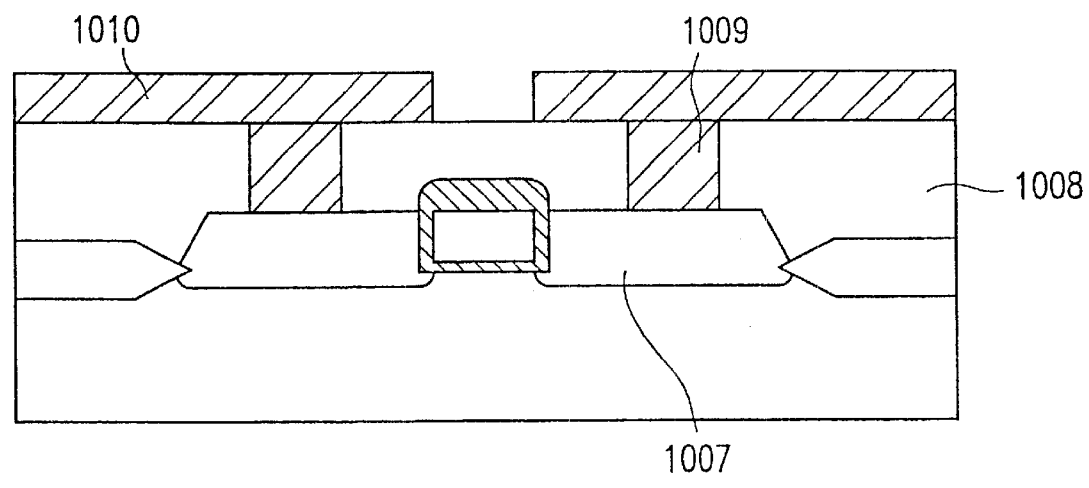

FIG. 19B shows an equivalent circuit of the semiconductor structure shown in FIG. 19A, where transistors are connected in series. In order to ensure that the respective transistors become independent of each other (i.e., so that the source/drain regions of adjoining transistors are separated into discrete source/drain regions) under the condition 2d>t (i.e., so as to reduced the occupied area), a method shown in FIG. 20 or 21 can be adopted. For example, as shown in FIG. 20, the source/drain regions may be separated by etching or the like. The etching for separating the source/drain regions 610 can be performed concurrently with the etching for eliminating the remainders of the polycrystalline silicon film around the gate electrode lateral wall insulation films as shown in FIG. 10, thereby preventing an increase in the number of etching steps.

Alternatively, a dummy gate electrode may be formed for separation between the source/drain regions, as shown in FIG. 21.

The subsequent steps are similar to those described in Example 3, and the description thereof is omitted.

Although Examples 1–4 and 6 assume that the substrate of the semiconductor device is a bulk silicon substrate, the substrate is not limited thereto. For example, an SiC substrate or a sapphire substrate can be employed to practice the present invention.

According to the present example, the surface of each source/drain region exhibits a curved and/or slanted profile in a cross section taken along the direction (X–X') perpendicular to the longitudinal direction of the gate electrodes. As a result, the surface area of each source/drain region of the semiconductor device (relative to the area which is occupied by the source/drain region) can be more effectively increased according to the present example than in conventional structures incorporating source/drain regions having a linear profile.

By etching back polycrystalline silicon to form source/drain regions stacked above the channel region according to the present example, source/drain regions 206 having a rugged surface can be formed, thereby providing a further increased surface area.

According to the present invention, it is easy to reduce the junction depth of the source/drain region impurity diffusion layers relative to the channel region of the transistor. As a result, so-called short channel effects can be effectively prevented. Such a shallow junction can be realized without employing an epitaxial growth technique, thereby controlling the short channel effects. Moreover, the diffusion control according to the present invention is easier than in the case of using an epitaxial growth technique, resulting in smaller variation in the device characteristics. Since the active region is not exposed to the atmosphere after the source/drain regions are formed, the active region is prevented from being damaged and/or contaminated during etching and/or ion implantation.

In accordance with an embodiment of the invention, when performing a heat treatment for diffusing and activating an impurity, the diffusion occurs very rapidly down to the interface with the semiconductor substrate, but only slowly into the silicon substrate. As a result, the depth of the source/drain regions from the interface with the semiconductor substrate is less likely to be affected by variation in the height of the stacked regions, thereby making it possible to produce a shallow junction with much controllability.

In accordance with an embodiment of the invention, the grain size of the polycrystalline silicon is about 50 nm or less so that it is possible to minimize the variation in the width of the polycrystalline silicon side walls due to the grains of polycrystalline silicon, and it is also easy to control diffusion, thereby minimizing variation in the device characteristics.

In accordance with the structure of the invention, the problem of low yield due to vertical protrusions of gate portions during manufacture of semiconductor devices can be relieved. For example, it is easy to flatten the interlayer insulation film. Moreover, in a conventional structure including vertical protrusions of gate portions, the etching rate for an etch stopper layer may undesirably increase at vertical protrusions of gate portions during the contact etching in a self-aligned contact (SAC) process, thereby resulting in contact insufficiency. Such problems are also prevented by the present invention.

In accordance with an embodiment of the invention, the above-illustrated stacked source/drain regions can be easily obtained simply by prescribing an etching amount to ensure removal of the polycrystalline silicon film above the gate electrode. Since a polycrystalline silicon film is deposited whose thickness is larger than the distance between the gate electrode and each device separation region (i.e., the width of each source/drain region), the silicon substrate is prevented from being exposed and damaged by an anisotropic etch-back process. By forming the stacked layers by the sides of the gate electrode lateral walls through an anisotropic etch-back process, it is ensured that the end of each stacked layer extends at least partially onto a device separation region, which is formed of a material which substantially withstands silicon etching.

In accordance with an embodiment of the invention, the introduction of an impurity to become a donor or acceptor in the source region, drain region, and a gate electrode can be simultaneously performed by an ion implantation process. As a result, a surface channel-type device can be produced by a small number of ion implantation steps. As described above, the stacked layers of source/drain regions (which are stacked above the semiconductor substrate) are composed of a material such that the diffusion coefficient of an impurity within the stacked layers is larger than the diffusion coefficient of an impurity within the semiconductor substrate. As a result, even by simultaneously performing the impurity doping for the gate electrode and the impurity doping for the source/drain regions, it is possible to produce a device which can prevent the depletion of the gate electrode and the penetration of the impurity into the channel region, and which does not have an offset configuration (i.e., a configuration in which the source/drain regions do not substantially reach the channel region in the lateral direction due to insufficient diffusion).

A semiconductor device produced according to the present invention includes a device separation region, an active region, a gate oxide film, a source/drain region, and an electrode which is electrically coupled to the source/drain region, in such a manner that the active region is in contact with the gate oxide film at a first face, a portion of the source/drain regions being located above the first face; and that the electrode is in contact with the source/drain region at a second face, the second face constituting an angle with respect to the first face. As a result, the area occupied by the source/drain regions can be reduced, thereby reducing the parasitic capacitance and parasitic resistance of the source/drain regions.

The surface area of each source/drain region can be increased relative to the area which is occupied by the source/drain regions on the active region. As a result, the contact area between the source/drain regions and the upper wiring can be increased, thereby lowering the contact resistance.

Since the distance between the channel region and a contact hole is very small, the distance between the high-resistance impurity diffusion regions, over which an electric current flows, becomes very small. As a result, the parasitic resistance is minimized.

Since the size of the area occupied by the device, especially the area occupied by the source/drain regions, can be reduced without changing the size of the upper wiring to source/drain contact, it is possible to minimize the junction area between the source/drain regions and the semiconductor substrate (or a well region having the opposite conductive type to that of the source/drain regions in a general CMOS device) without increasing the upper wiring to source/drain contact resistance. As a result, the junction capacitance can be effectively reduced. Accordingly, the occupied area, the parasitic capacitance (junction capacitance), and the parasitic resistance can be reduced without increasing the contact resistance. Consequently, a very large transconductance is obtained, and yet the capacitance required for charging is reduced. Thus, the operation speed of the circuitry designed in accordance with the present invention is improved.

In accordance with the present invention, the ratio of the region having a high resistance within the current path is very small, so that the parasitic resistance of the source/drain regions is reduced as compared to that of a conventional semiconductor device. Furthermore, the current path is expanded toward the contact and away from the portions of the source/drain regions adjacent the channel region, thereby minimizing the parasitic resistance. Due to these effects, the current driving performance and the transconductance of the device are improved.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for producing a semiconductor device comprising a device separation region and an active region, the method comprising the steps of:

forming the device separation region on a silicon substrate from a material which substantially withstands silicon etching;

sequentially forming a gate insulation film, a gate electrode, and a gate electrode lateral wall insulation film;

coating a polycrystalline silicon film having a thickness which is larger than a distance between the gate electrode and the device separation region along a direction perpendicular to a longitudinal direction of the gate electrode; and performing an anisotropic etching until the polycrystalline silicon film above the gate electrode is substantially removed.

2. A method according to claim 1, further comprising an ion implantation step of introducing an impurity to form the source/drain region, the impurity becoming one of a donor and an acceptor, and wherein the gate electrode is formed by the introduction of the impurity to become the one of a donor and an acceptor; and the introduction of the impurity to become the one of a donor or an acceptor for the gate electrode and the source/drain region is performed simultaneously by ion implantation.

3. A method for producing a semiconductor device comprising the steps of:

forming a device separation region on a silicon substrate from a material which substantially withstands silicon etching;

sequentially forming a gate insulation film, a gate electrode, and a gate electrode lateral wall insulation film;

coating a polycrystalline silicon film;

performing an anisotropic etching until the polycrystalline silicon film above the gate electrode is substantially removed; and removing a portion of the polycrystalline silicon film, the polycrystalline silicon film having been formed on a lateral wall of the gate electrode with the gate electrode lateral wall insulation film being interposed between the polycrystalline silicon film and the lateral wall of the gate electrode.

* * * * *